(12) United States Patent
Ding

(10) Patent No.: US 6,951,782 B2
(45) Date of Patent: Oct. 4, 2005

(54) NONVOLATILE MEMORY CELL WITH MULTIPLE FLOATING GATES FORMED AFTER THE SELECT GATE AND HAVING UPWARD PROTRUSIONS

(75) Inventor: Yi Ding, Sunnyvale, CA (US)

(73) Assignee: ProMOS Technologies, Inc., Hsin-Chu (TW)

( * ) Notice: Subject to any disclaimer, the term of this patent is extended or adjusted under 35 U.S.C. 154(b) by 68 days.

(21) Appl. No.: 10/632,186

(22) Filed: Jul. 30, 2003

(65) Prior Publication Data

US 2005/0023591 A1 Feb. 3, 2005

(51) Int. Cl.[7] .............................................. H01L 21/332
(52) U.S. Cl. ...................... 438/137; 438/257; 438/264; 438/593; 438/594
(58) Field of Search .......................... 438/137, 263–266, 438/257, 593–594

(56) References Cited

U.S. PATENT DOCUMENTS

| 5,402,371 A | 3/1995 | Ono |
| 5,445,983 A | 8/1995 | Hong |
| 5,668,757 A | 9/1997 | Jeng |

(Continued)

FOREIGN PATENT DOCUMENTS

EP 0 938 098 A2 8/1999

OTHER PUBLICATIONS

Shirota, Riichiro "A Review of 256Mbit NAND Flash Memories and NAND Flash Future Trend," Feb. 2000, Nonvolatile Memory Workshop in Monterey, California, pp. 22–31.

Naruke, K.; Yamada, S.; Obi, E.; Taguchi, S.; and Wada, M. "A New Flash–Erase EEPROM Cell with A Sidewall Select– Gate On Its Source Side," 1989 IEEE, pp. 604–606.

Wu, A.T.; Chan T.Y.; Ko, P.K.; and Hu, C. "A Novel High–Speed, 5–Volt Programming EPROM Structure With Source–Side Injection," 1986 IEEE, 584–587.

(Continued)

*Primary Examiner*—Thanh Nguyen
(74) *Attorney, Agent, or Firm*—Michael Shenker; MacPherson Kwok Chen & Heid LLP

(57) ABSTRACT

In a nonvolatile memory cell having at least two floating gates, each floating gate (160) has an upward protruding portion. This portion can be formed as a spacer over a sidewall of the select gate (140). The spacer can be formed from a layer (160.2) deposited after the layer (160.1) which provides a lower portion of the floating gate. Alternatively, the upward protruding portion and the lower portion can be formed from the same layers or sub-layers all of which are present in both portions. The control gate (170) can be defined without photolithography. Other embodiments are also provided.

39 Claims, 30 Drawing Sheets

U.S. PATENT DOCUMENTS

| | | | |
|---|---|---|---|
| 5,705,415 | A | 1/1998 | Orlowski et al. |
| 5,856,943 | A | 1/1999 | Jenq |
| 5,901,084 | A | 5/1999 | Ohnakado |
| 5,910,912 | A | 6/1999 | Hsu et al. |
| 5,912,843 | A * | 6/1999 | Jeng ..................... 365/185.14 |
| 5,918,124 | A | 6/1999 | Sung |
| 6,040,216 | A | 3/2000 | Sung |
| 6,057,575 | A | 5/2000 | Jenq |
| 6,107,141 | A | 8/2000 | Hsu et al. |
| 6,130,129 | A | 10/2000 | Chen |
| 6,133,098 | A | 10/2000 | Ogura et al. |
| 6,134,144 | A | 10/2000 | Lin et al. |
| 6,162,682 | A | 12/2000 | Kleine |
| 6,171,909 | B1 | 1/2001 | Ding et al. |
| 6,187,636 | B1 | 2/2001 | Jeong |
| 6,200,856 | B1 | 3/2001 | Chen |
| 6,214,669 | B1 | 4/2001 | Hisamune |
| 6,218,689 | B1 | 4/2001 | Chang et al. |
| 6,228,695 | B1 | 5/2001 | Hsieh et al. |
| 6,232,185 | B1 * | 5/2001 | Wang .......................... 438/286 |
| 6,261,903 | B1 | 7/2001 | Chang et al. |
| 6,265,739 | B1 | 7/2001 | Yaegashi et al. |
| 6,266,278 | B1 | 7/2001 | Harari et al. |
| 6,294,297 | B1 | 9/2001 | Chen |
| 6,326,661 | B1 | 12/2001 | Dormans et al. |
| 6,344,993 | B1 | 2/2002 | Harari et al. |
| 6,355,524 | B1 | 3/2002 | Tuan et al. |
| 6,365,457 | B1 | 4/2002 | Choi |
| 6,414,872 | B1 | 7/2002 | Bergemont et al. |
| 6,420,231 | B1 | 7/2002 | Harari et al. |
| 6,436,764 | B1 * | 8/2002 | Hsieh ......................... 438/257 |
| 6,437,360 | B1 | 8/2002 | Cho et al. |
| 6,438,036 | B2 | 8/2002 | Seki et al. |
| 6,468,865 | B1 | 10/2002 | Yang et al. |
| 6,486,023 | B1 | 11/2002 | Nagata |
| 6,518,618 | B1 | 2/2003 | Fazio et al. |
| 6,541,324 | B1 | 4/2003 | Wang |
| 6,541,829 | B2 | 4/2003 | Nishinohara et al. |
| 6,566,196 | B1 | 5/2003 | Haselden et al. |
| 6,635,533 | B1 | 10/2003 | Chang et al. |
| 6,642,103 | B2 | 11/2003 | Wils |
| 6,660,589 | B2 | 12/2003 | Park |
| 6,696,340 | B2 | 2/2004 | Furuhata |
| 6,747,310 | B2 | 6/2004 | Fan et al. |
| 6,803,276 | B2 | 10/2004 | Kim et al. |
| 2002/0064071 | A1 | 5/2002 | Takahashi et al. |
| 2002/0197888 | A1 | 12/2002 | Huang et al. |
| 2003/0205776 | A1 | 11/2003 | Yaegashi et al. |
| 2003/0218908 | A1 | 11/2003 | Park et al. |
| 2004/0004863 | A1 | 1/2004 | Wang |

OTHER PUBLICATIONS

Mizutani, Yoshihisa; and Makita, Koji "A New EPROM Cell With A Sidewall Floating Gate Fro High–Density and High Performance Device," 1985 IEEE, 635–638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split–Gate Source–Side–Injection Cell for 5V–Only Applications," 1994 Symposium on VLSI Technology Digest of Technical Papers, pp. 49–50.

Mih, Rebecca et al. "0.8um Modular Triple Self–Aligned Embedded Split–Gate Flash Memory," 2000 Symposium on VLSI Technology Digest of Technical Papers, pp. 120–121.

Ma, Yale et al., "A Dual–Bit Split–Gate EEPROM (DSG) Cell in Contactless Array for Single Vcc High Density Flash Memories," 1994 IEEE, 3.5.1–3.5.4.

Spinelli, Alessandro S., "Quantum–Mechanical 2D Simulation of Surface–and Buried–Channel p–MOS,"2000 International Conference on Simulation of Semiconductor Processes and Devices: SISPAD 2000, Seattle, WA Sep. 6–8, 2000.

Kim, K.S. et al. "A Novel Dual String NOR (DuSnor) Memory Cell Technology Scalable to the 256 Mbit and 1 Gbit Flash Memories," 1995 IEEE 11.1.1–11.1.4.

Bergemont, A. et al."NOR Virtual Ground (NVG)– A New Scaling Concept for Very High Density FLAS EEPROM and its Implementation in a 0.5 um Process," 1993 IEEE 2.2.1–2.2.4.

Van Duuren, Michiel et al., "Compact poly–CMP Embedded Flash Memory Cells For One or Two Bit Storage," Philips Research Leuven, Kapeldreef75, B3001 Leuven, Belgium, p. 73–74.

U.S. Appl. No. 10/440,446, entitled "Fabrication Of Conductive Gates For Nonvolatile Memories From Layers With Protruding Portions," filed on May 16, 2003.

U.S. Appl. No. 10/440,005, entitled "Fabrications Of Dielectric On A Gate Surface To Insulate The Gate From Another Element Of An Integrated Circuit," filed on May 16, 2003.

U.S. Appl. No. 10/440,508, entitled "Fabrication Of Gate Dielectric In Nonvolatile Memories Having Select, Floating And Control Gates," filed on May 16, 2003.

U.S. Appl. No. 10/440,500, entitled "Integrated Circuits With Openings that Allow Electrical Contact To Conductive Features Having Self–Aligned Edges," filed on May 16, 2003.

U.S. Appl. No. 10/393,212, entitled "Nonvolatile Memories And Methods Of Fabrication," filed on Mar. 19, 2003.

U.S. Appl. No. 10/411,813, entitled "Nonvolatile Memories With A Floating Gate Having An Upward Protrusion," filed on Apr. 10, 2003.

U.S. Appl. No. 10/393,202, entitled "Fabrication of Integrated Circuit Elements In Structures With Protruding Features," filed on Mar. 19, 2003.

U.S. Appl. No. 10/631,941, entitled "Nonvolatile Memory Cell With Multiple Floating Gates Formed After The Select Gate," filed on Jul. 30, 2003.

U.S. Appl. No. 10/632,155, entitled "Nonvolatile Memory Cells With Buried Channel Transistors," filed on Jul. 30, 2003.

U.S. Appl. No. 10/632,007, entitled "Arrays Of Nonvolatile Memory Cells Wherin Each Cell Has Two Conductive Floating Gates," filed on Jul. 30, 2003.

U.S. Appl. No. 10/631,452, entitled "Fabrication Of Dielectric For A Nonvolatile Memory Cell Having Multiple Floating Gates," filed on Jul. 30, 2003.

U.S. Appl. No. 10/632,154, entitled "Fabrication Of Gate Dielectric In Nonvolatile Memories In Which A Memory Cell Has Multiple Floating Gates," filed on Jul. 30, 2003.

U.S. Appl. No. 10/631,552, entitled "Nonvolatile Memories And Methods Of Fabrication," filed on Jul. 30, 2003.

U.S. Appl. No. 10/798,475, entitled "Fabrication Of Conductive Lines Interconnecting Conducive Gates in Nonvolatile Memories and Non–Volatile Memory Structures," filed on Mar. 10, 2004.

U.S. Appl. No. 10/797,972, entitled "Fabrication of Conductive Lines Interconnecting First Conductive Gates in Nonvolatile Memories Having Second Conductive Gates Provided By Conductive Gates Lines, Wherein The Adjacent Conductive Gate Lines For The Adjacent Columns Are Spaced From Each Other, And Non–Volatile Memory Structures," filed on Mar. 10, 2004.

* cited by examiner

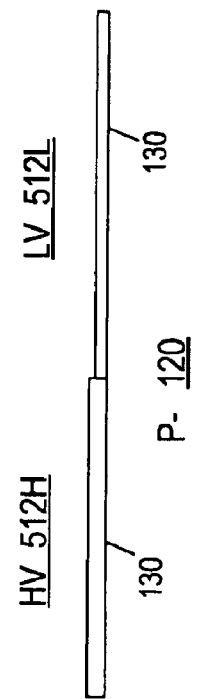
FIG. 13 (Y1-Y1')
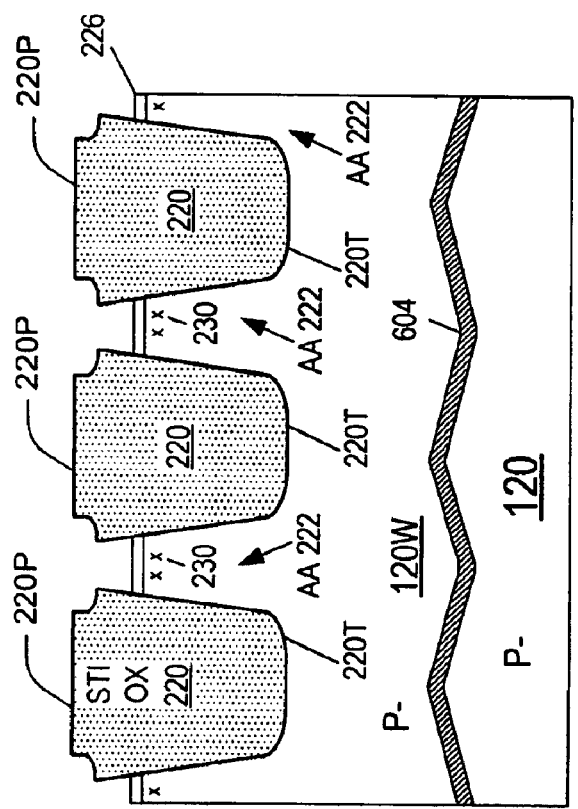
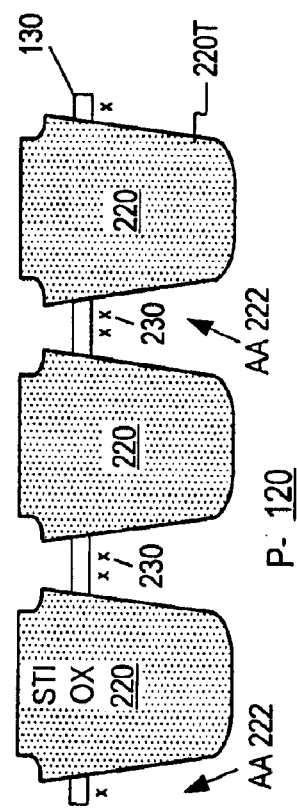
FIG. 14B (PERIPHERY)
FIG. 14A (Y1-Y1')

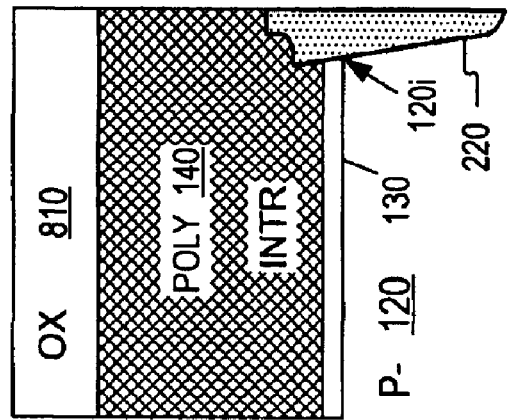
FIG. 15B (PERIPHERY)
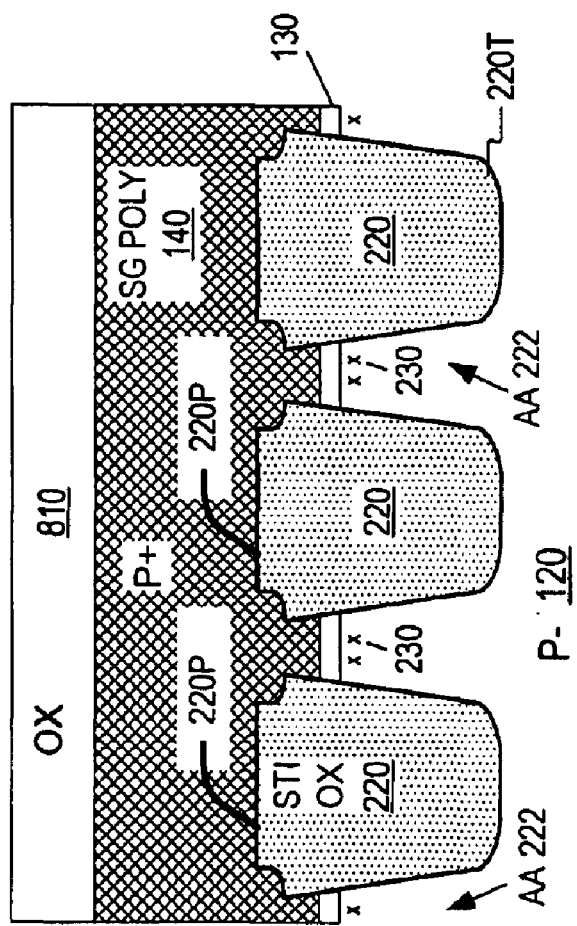
FIG. 15A (Y1-Y1')

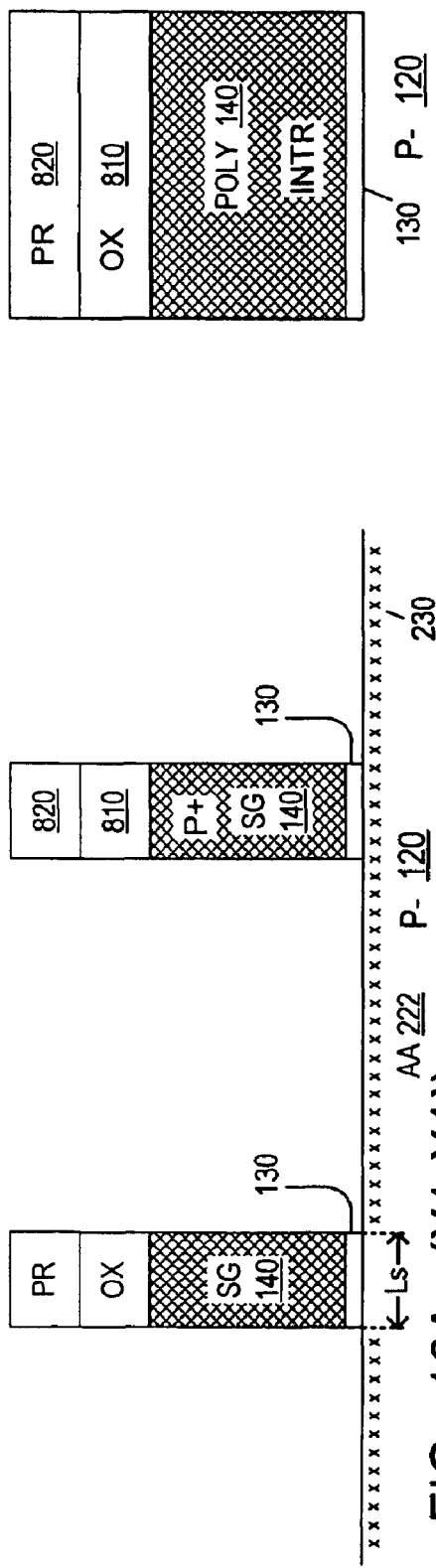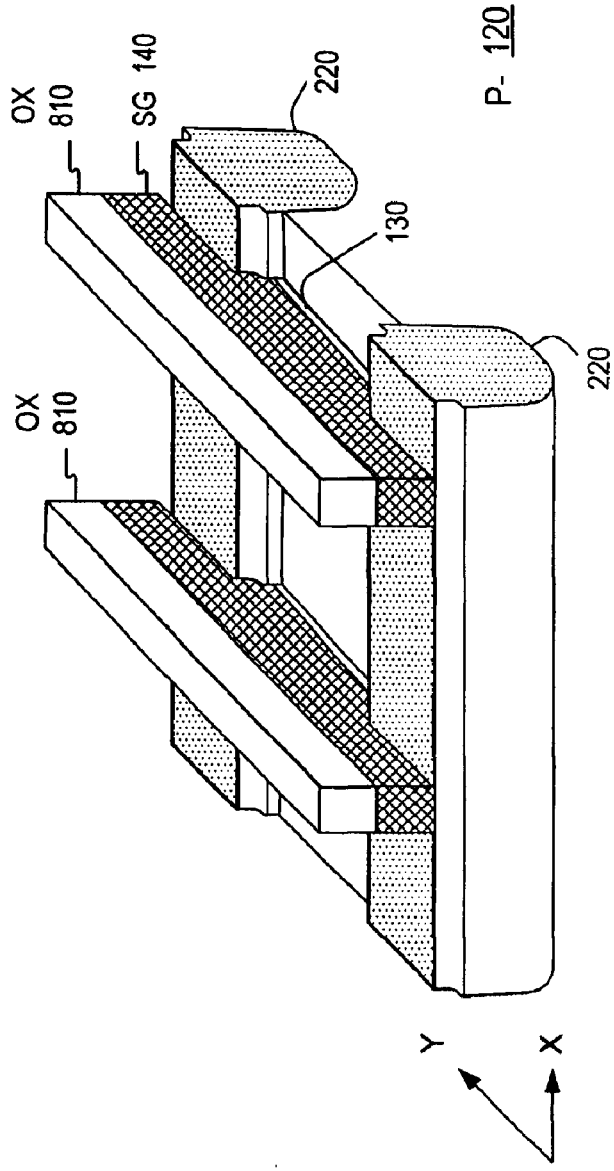

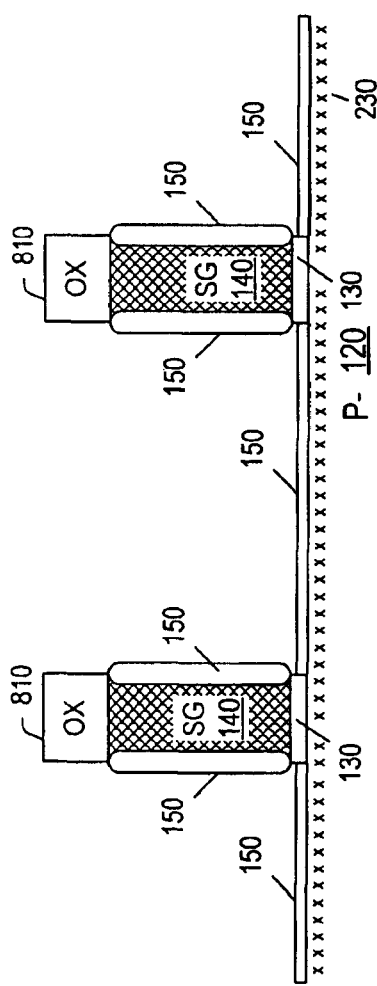
FIG. 18 (X1-X1')
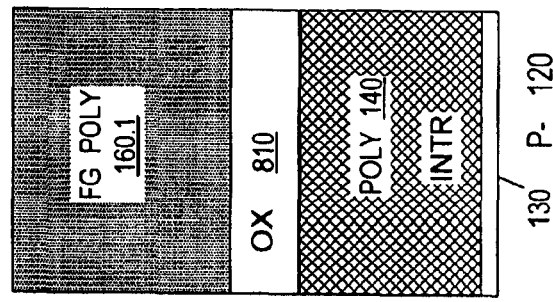
FIG. 19B (PERIPHERY)
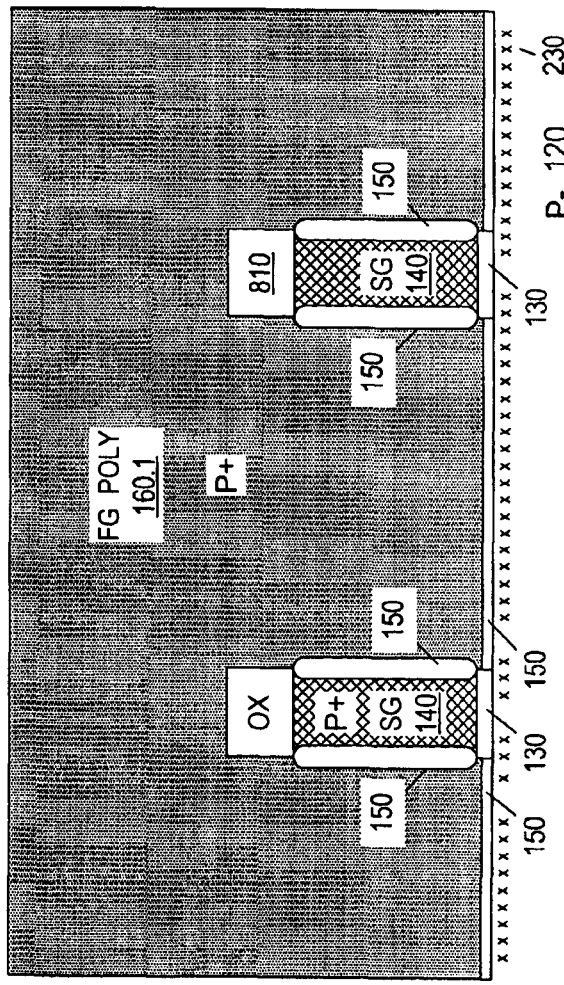
FIG. 19A (X1-X1')

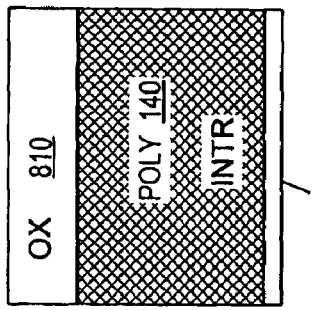
FIG. 20B (PERIPHERY)
FIG. 21A (X1-X1')
FIG. 21B (Y2-Y2')
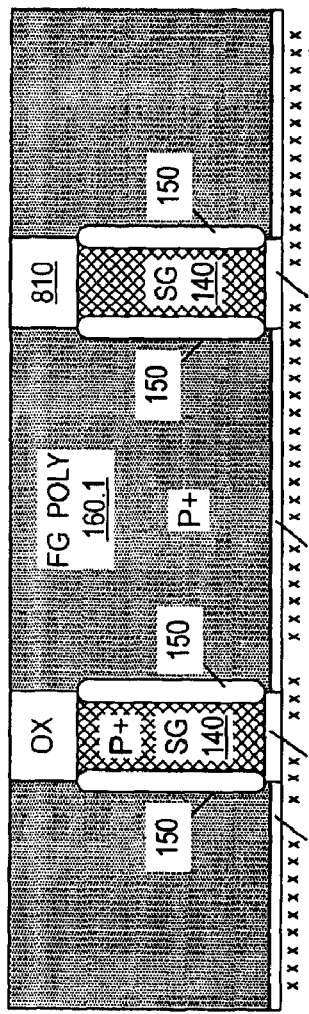
FIG. 20A (X1-X1')
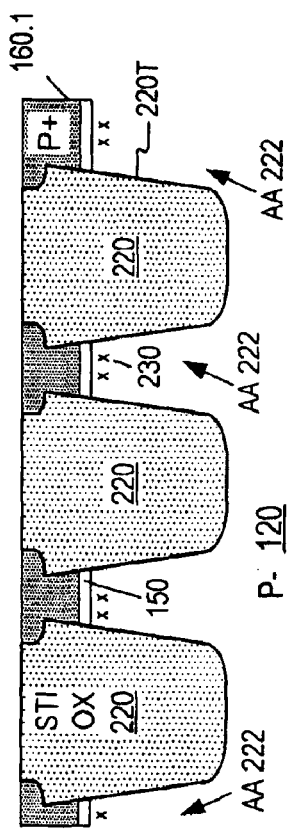

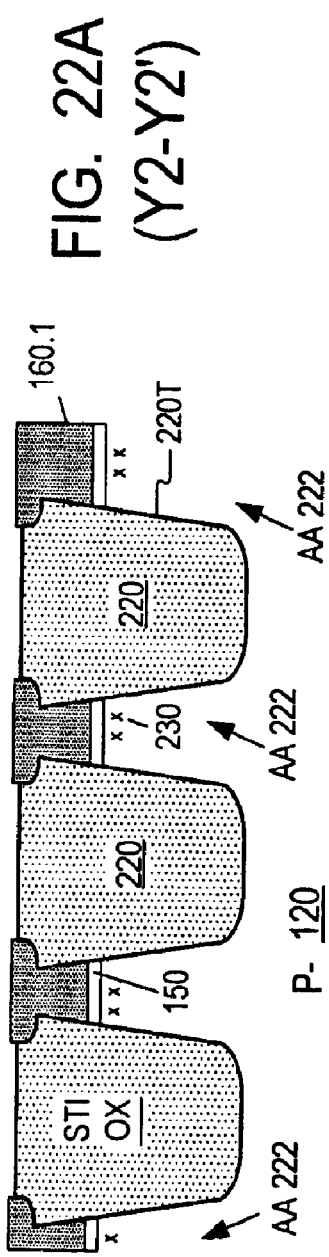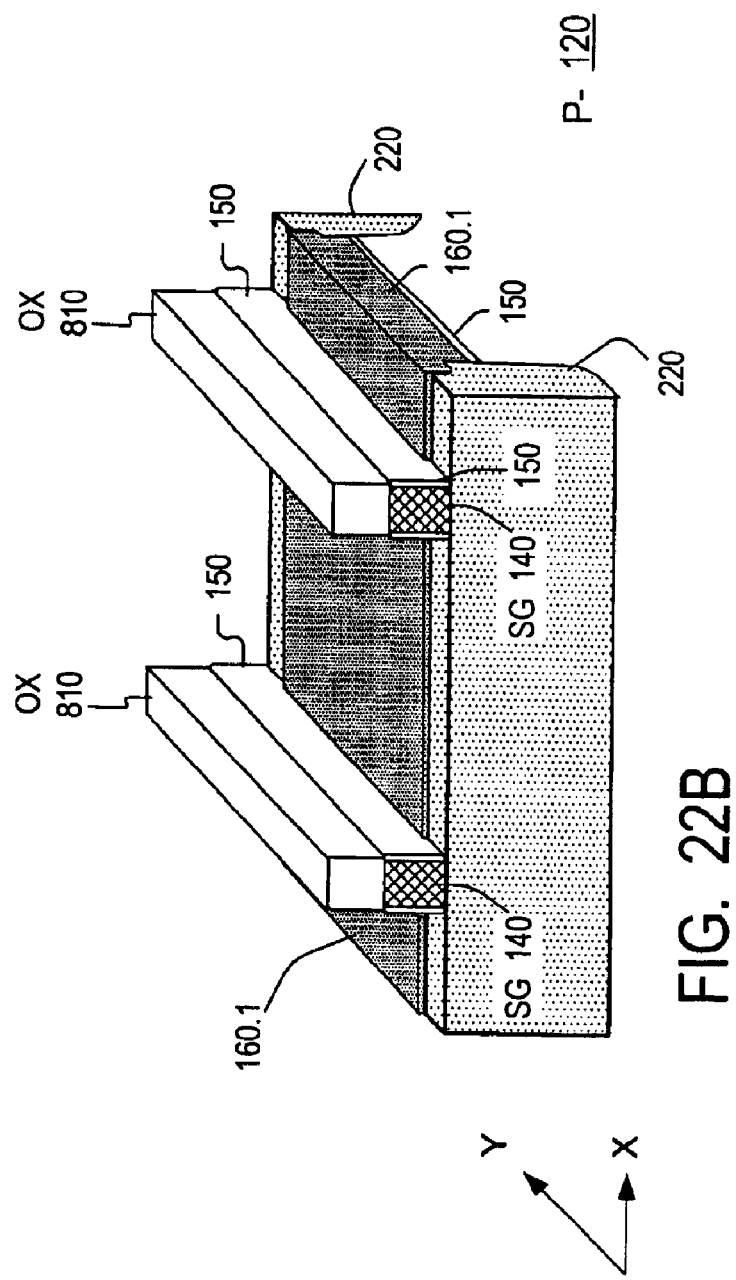

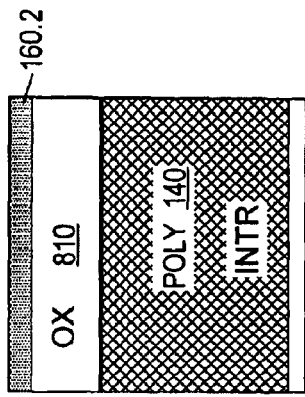
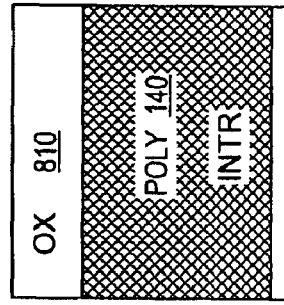
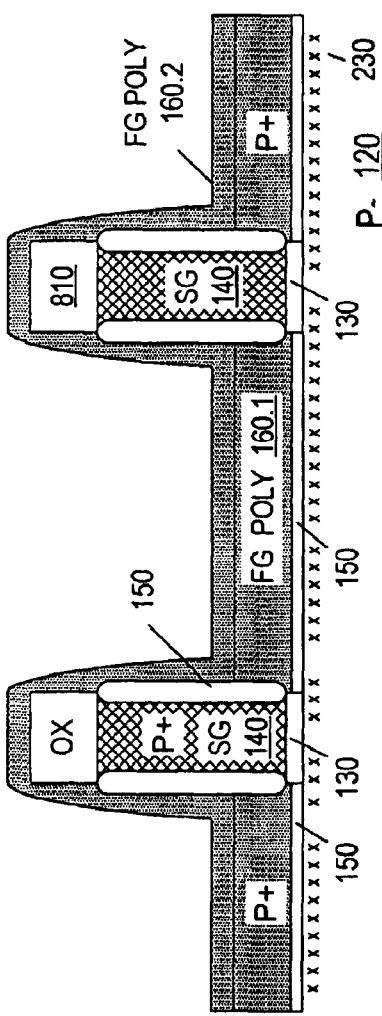
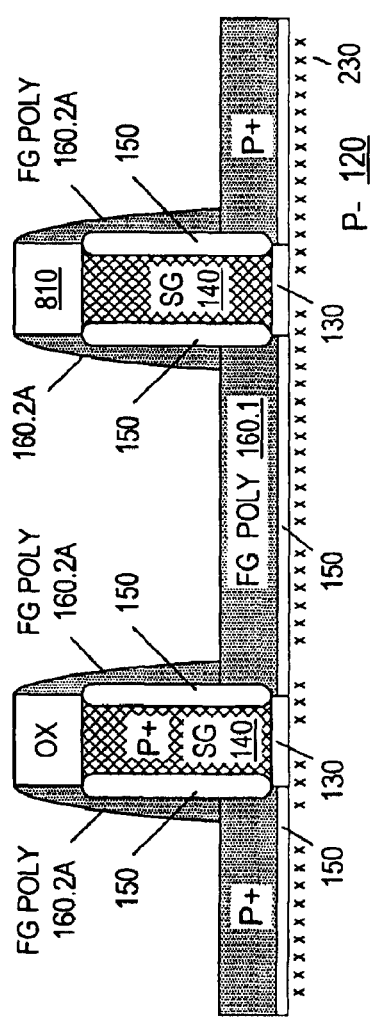

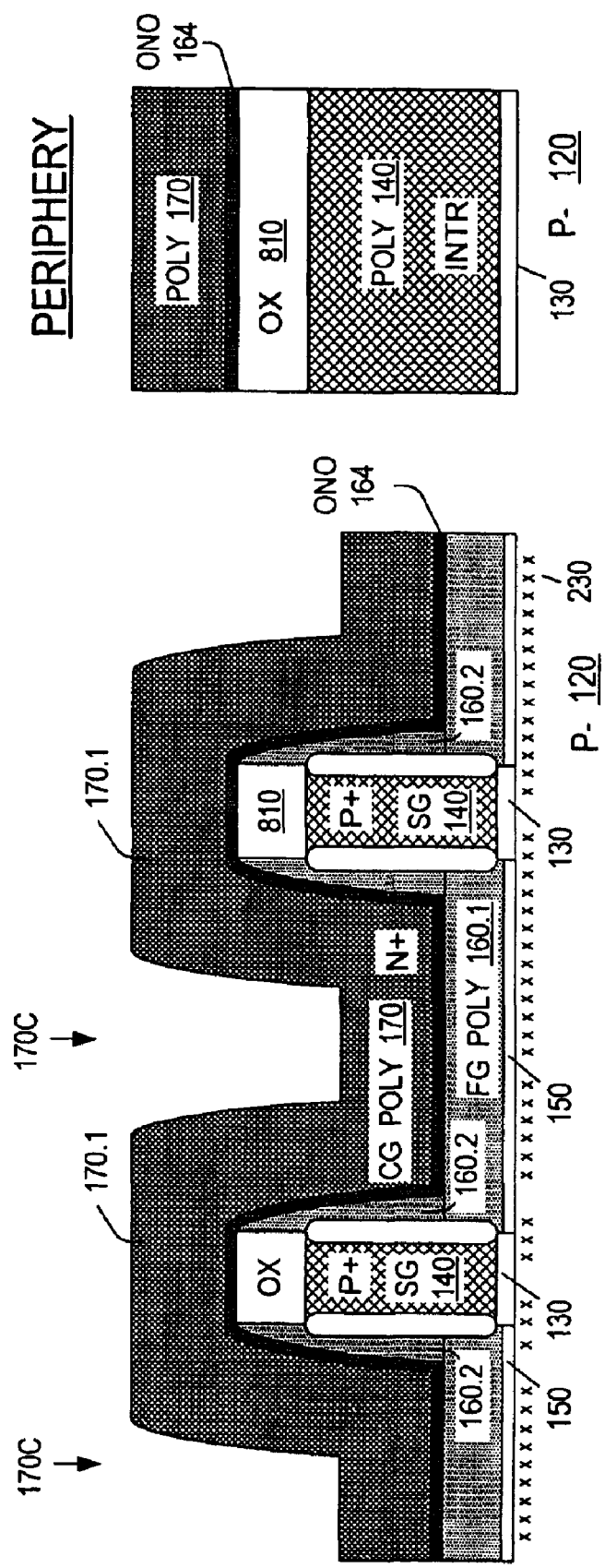

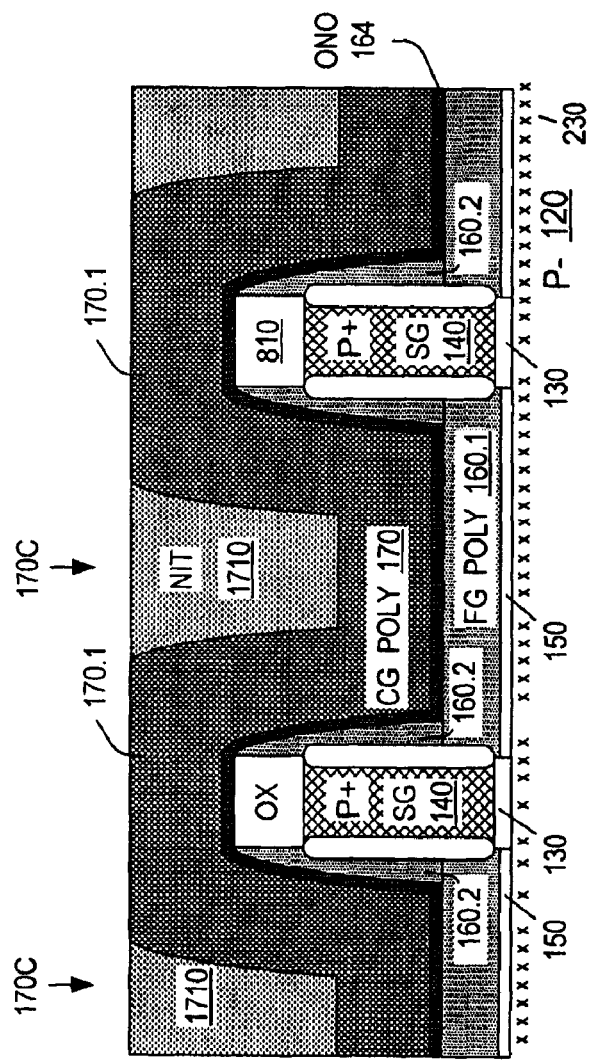
FIG. 28 (X1-X1')
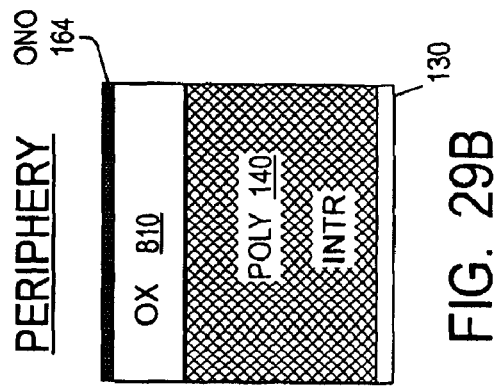
FIG. 29B
FIG. 29A (X1-X1')

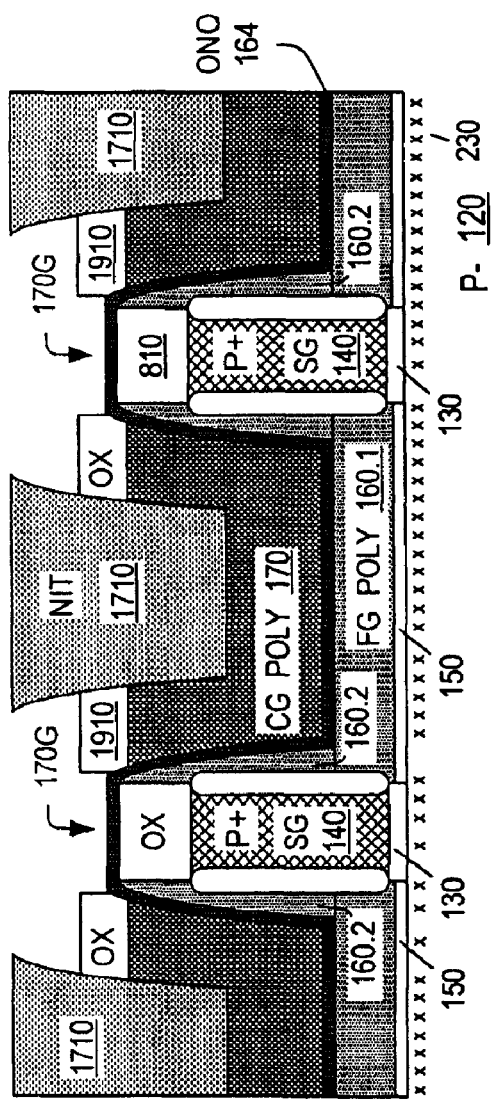
FIG. 30 (X1-X1')
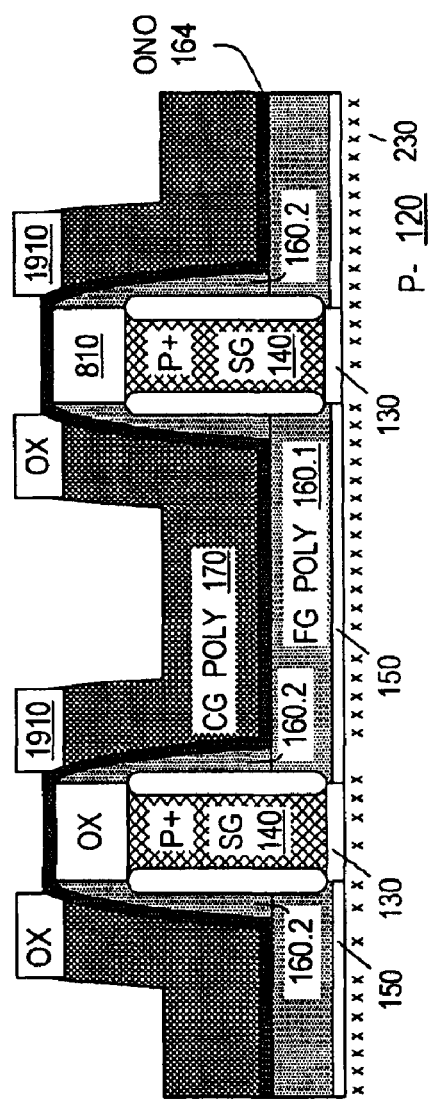
FIG. 31 (X1-X1')

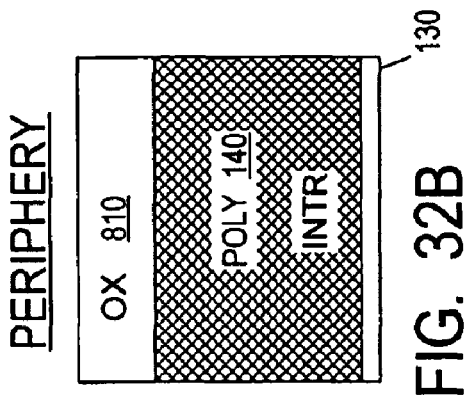
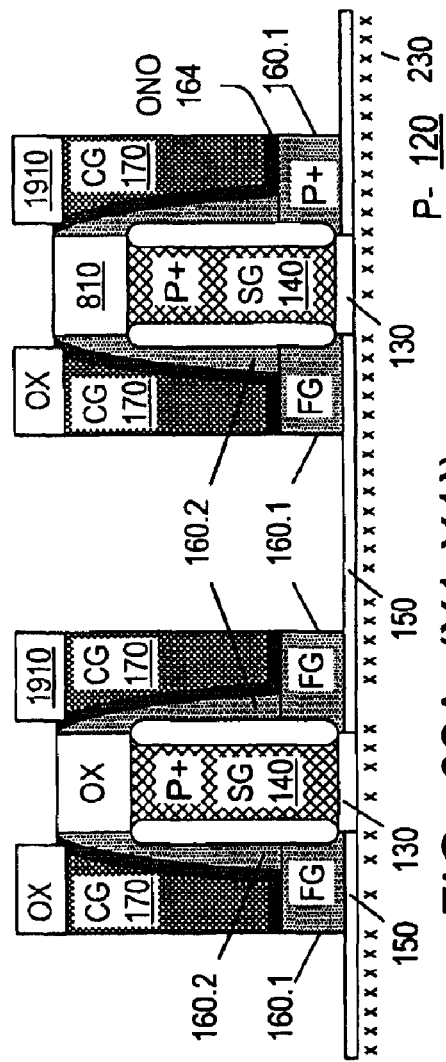
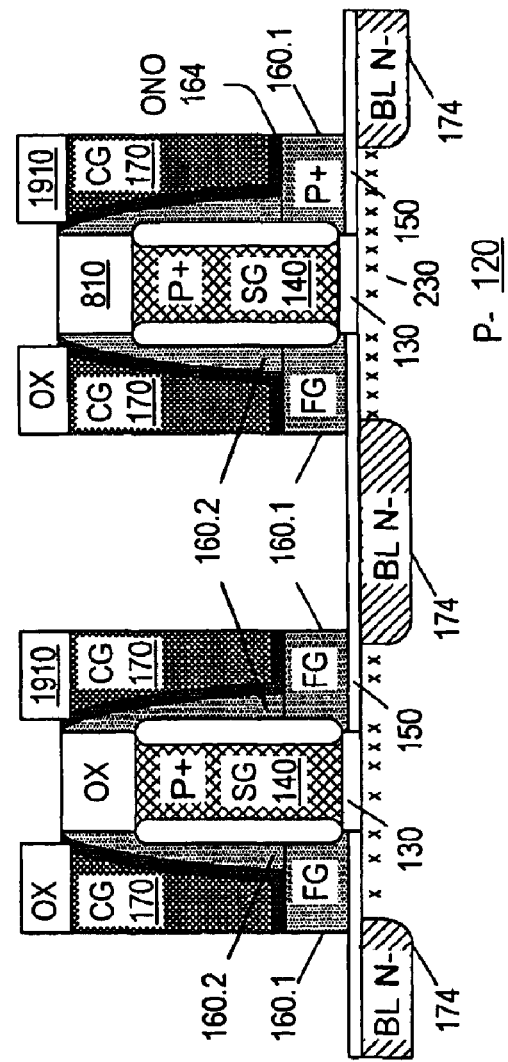

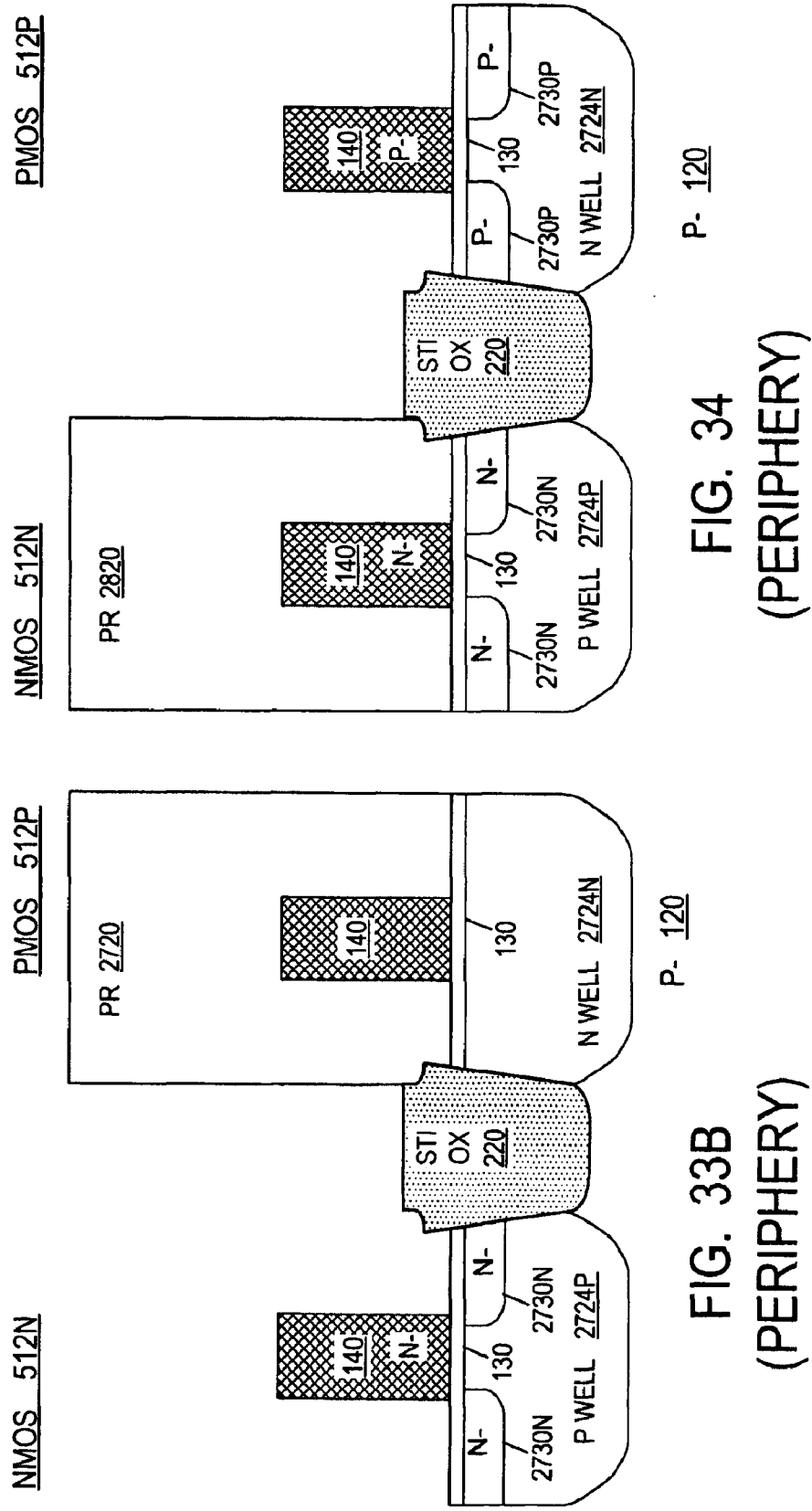

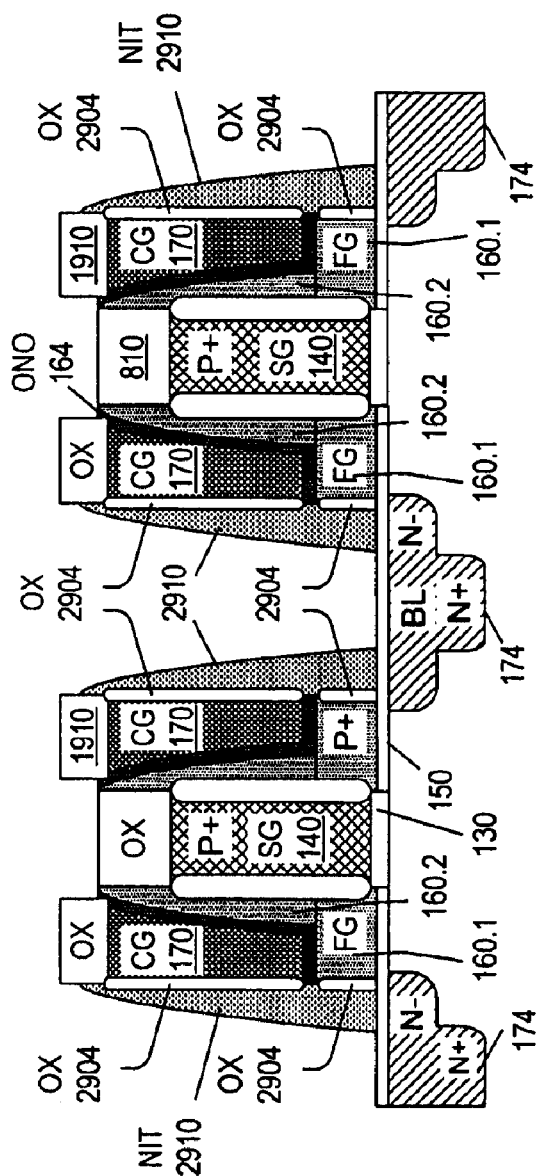
FIG. 35A (X1-X1')
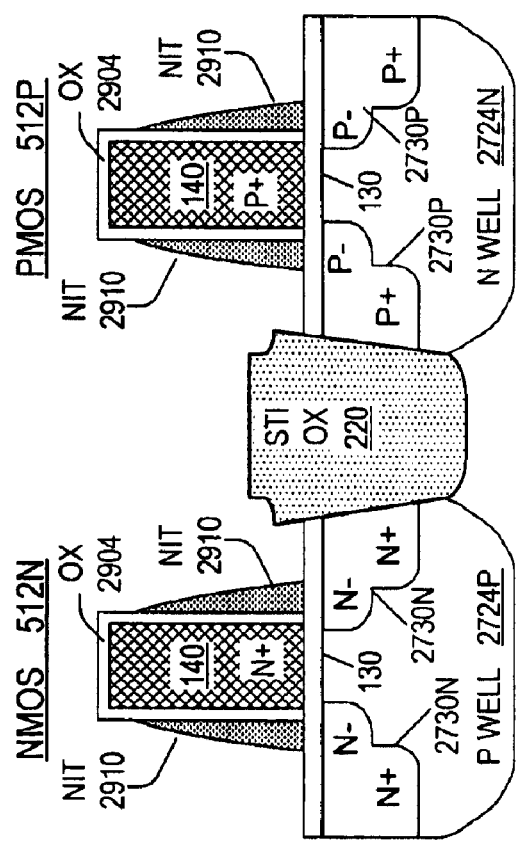
FIG. 35B (PERIPHERY)

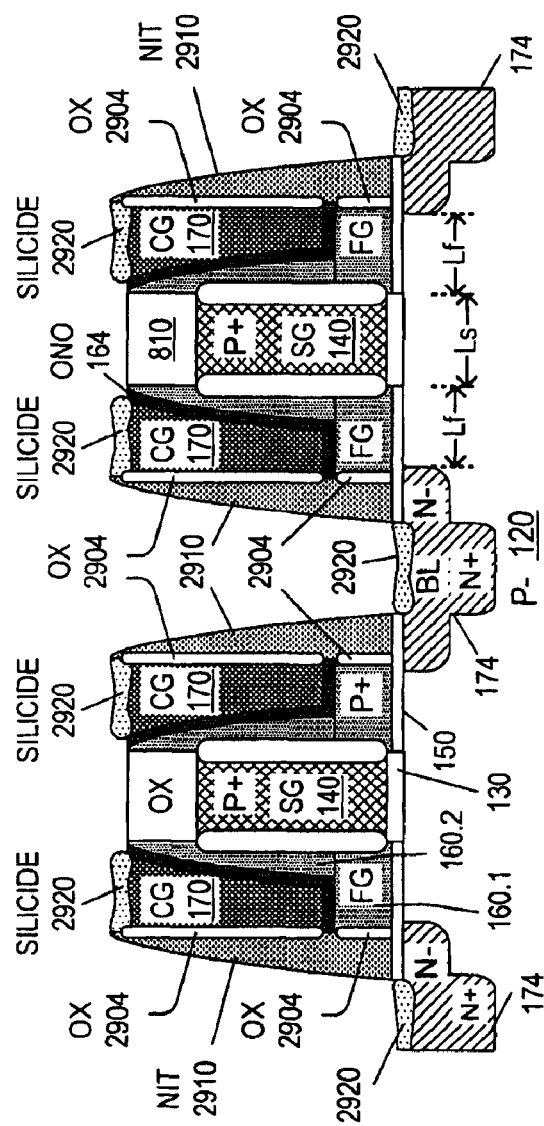
FIG. 36A (X1-X1')
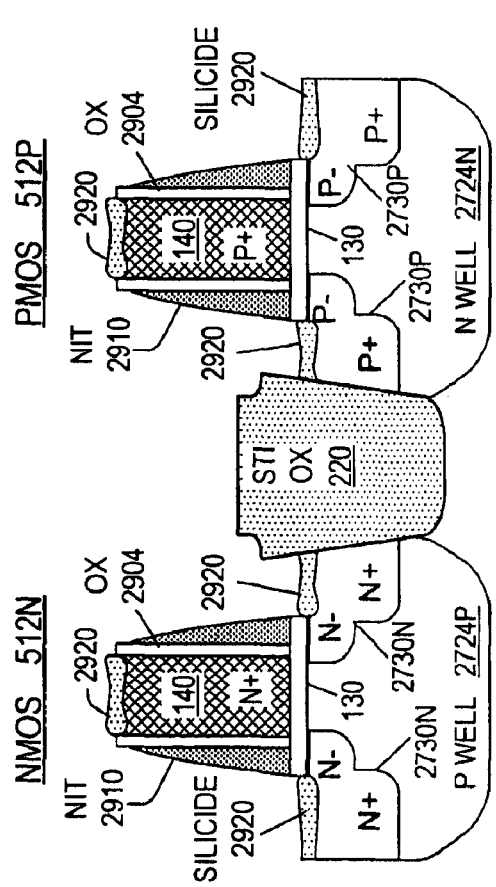
FIG. 36B (PERIPHERY)

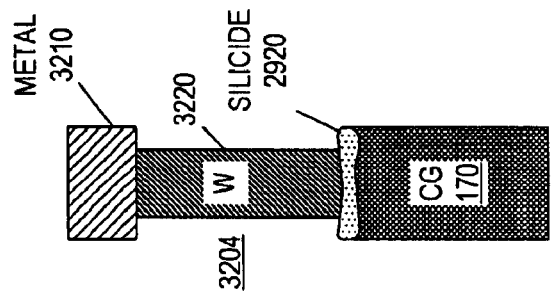
FIG. 37B (ARRAY GAP OR BOUNDARY)
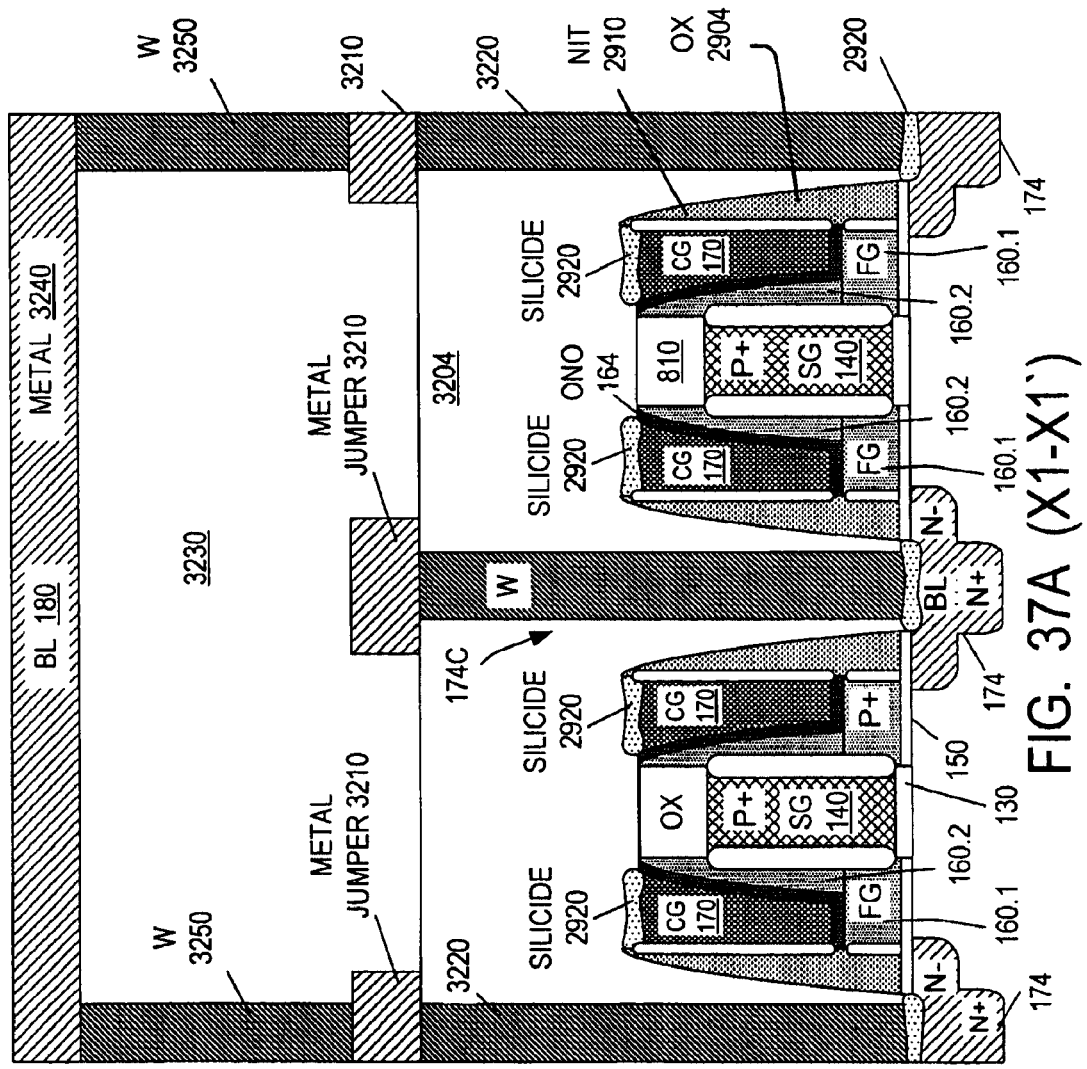
FIG. 37A (X1-X1')

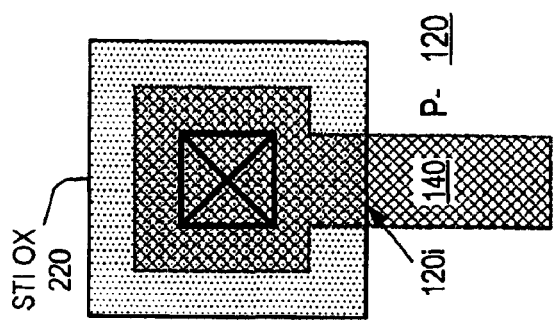
FIG. 37E (PERIPHERY)
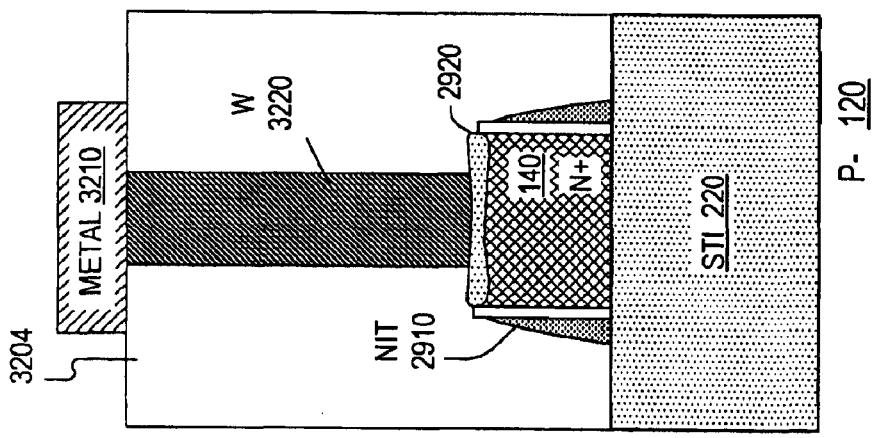
FIG. 37D (PERIPHERY)
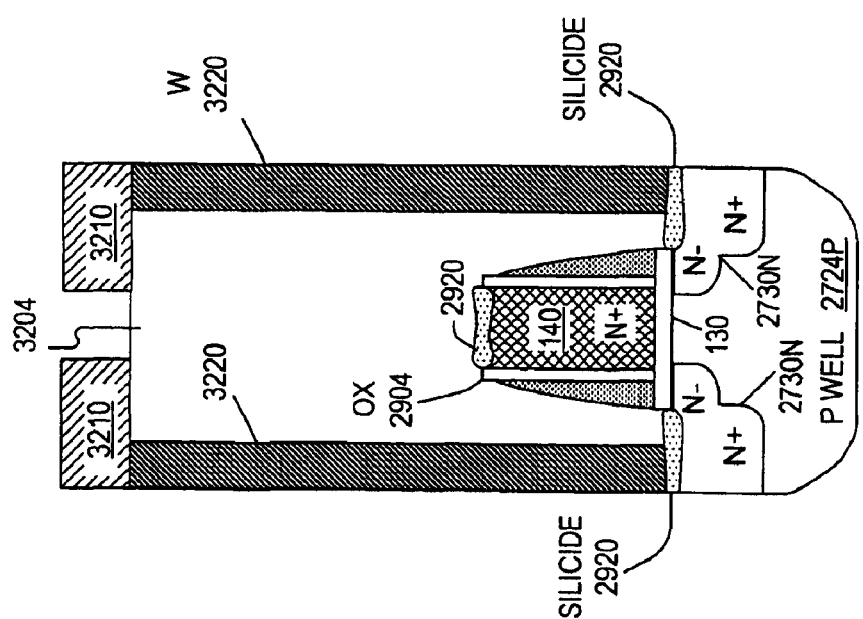
FIG. 37C (PERIPHERY)

NONVOLATILE MEMORY CELL WITH MULTIPLE FLOATING GATES FORMED AFTER THE SELECT GATE AND HAVING UPWARD PROTRUSIONS

BACKGROUND OF THE INVENTION

The present invention relates to nonvolatile memories.

FIGS. 1–4 illustrate a flash memory fabrication process described in van Duuren et al., "Compact poly-CMP embedded flash memory cells for one or two bit storage", Proceedings of NVSMW 2003 (Non-Volatile Semiconductor Memory Workshop), Monterey, Calif., pages 73–74. Tunnel oxide 150, polysilicon floating gate 160, inter-poly dielectric 164, control gate 170, and a nitride cap layer 172 are fabricated in a stacked structure ("FG/CG stack"). TEOS spacers 176 are formed on both sides of the stack. Then oxide 130 is grown for the access gate.

AG (access gate) polysilicon 140 is deposited over the FG/CG stack. See FIG. 2. Polysilicon 140 is polished by chemical mechanical polishing (CMP), as shown in FIG. 3. Then polysilicon 140 is patterned using resist 173 to define the access gate, as shown in FIGS. 3 and 4. Source/drain regions 174 are formed to obtain a one-bit memory cell 102 (FIG. 4).

As noted in the Duuren et al. article, the length of access gate 140 depends on the mask alignment, "which could lead to an odd-even word line effect in arrays".

FIG. 5 shows a two-bit memory cell 110 described in the same article. Two FG/CG stack transistors 110L, 110R share an access gate 140. According to the Duuren et al. article, the cell is fabricated with the same process as cell 102, but cell 110 is fully self-aligned and therefore not sensitive to mask misalignment.

Each bit 110L, 110R can be programmed or erased independently of the other bit. The bit can be programmed by Fowler-Nordheim tunneling (FN) or source side injection (SSI). The Duuren et al. article states that the two bit cell has been studied "with 180 bit arrays in a virtual ground configuration". The read, program (SSI) and erase voltages bit 110R are shown respectively in FIGS. 6, 7 and 8. In the read and program operations (FIGS. 6 and 7), the "pass" voltage for the control gate in bit 110L (6.0 V) is high enough to turn on the corresponding FG/CG transistor regardless of the state of its floating gate.

In order to reduce the memory operating voltages, it is desirable to increase the "gate coupling ratio", i.e. the ratio of the capacitance between the floating and control gates to the capacitance between the floating gate and the substrate or other elements of the integrated circuit.

SUMMARY

This section summarizes some features of the invention. Other features are described in the subsequent sections. The invention is defined by the appended claims which are incorporated into this section by reference.

The present invention relates to a memory cell having multiple floating gates (such as the cell of FIG. 5, for example). In some embodiments, the access gate is formed before the floating gates. In some embodiments, the memory cell also has control gates (like in FIG. 5), and the access gate is formed before the floating and control gates.

Below the term "select gate" is used instead of "access gate".

A memory cell having a single floating gate formed after the select gate is described in U.S. Pat. No. 6,057,575 issued May 2, 2000 to Jenq and illustrated in FIG. 9. The cell is fabricated as follows. Silicon dioxide 130 is thermally grown on substrate 120. Select gate 140 is formed on oxide 130. Silicon dioxide 150 is thermally grown on a region of substrate 120 not covered by the select gate. ONO 154 (a sandwich of a layer of silicon dioxide, a layer of silicon nitride, and a layer of silicon dioxide) is formed on select gate 140. Floating gate 160 is formed on dielectric layers 150, 154. A portion of floating gate 160 overlies the select gate 140.

ONO layer 164 is formed on the floating and select gates. Control gate 170 is formed on ONO 164. The control gate overlies floating gate 160 and select gate 140.

N+ source and drain regions 174, 178 are formed in substrate 120.

Since the floating gate 160 and the control gate 170 extend over the select gate, the capacitance between the floating and control gates is increased without a corresponding increase in the cell area. The capacitance is increased both due to the horizontal portions of the floating and control gates over the select gate, and due to the vertical portions along the sidewall of the select gate.

In order to reduce the memory array and increase the memory packing density, it is desirable to fabricate the memory using self-aligned processes, i.e. processes less dependent on photolithography. The cell of FIG. 9 can be fabricated by a self-aligned process in which the left and right edges of floating gate 160 and control gate 170 are defined by a single photolithographic mask.

In some embodiments of the present invention, a memory cell has two floating gates formed from two conductive layers. In each floating gate, the second conductive layer provides an upward protrusion adjacent to the select gate. The second layer is formed after the first layer. The upward protrusion can be formed as a spacer overlaying a sidewall of the select gate.

In other embodiments, both the upward protrusion and the lower portion of each floating gate are formed from the same layer or layers.

In some embodiments, the control gates are formed from a control gate layer deposited over the floating gate layer and over the select gates. The control gate layer protrudes upward over the select gates. These protrusions are exploited to define the control gates in a self-aligned manner without photolithography.

In some embodiments, when the memory cell is viewed from the top, the distance between each floating gate spacer and the select gate is smaller than the width of the select gate.

In some embodiments, each control gate overlies a portion of the corresponding floating gate, but the top of the control gate is not higher than the top of the floating gate.

Other features and advantages of the invention are described below. The invention is defined by the appended claims.

BRIEF DESCRIPTION OF THE DRAWINGS

FIGS. 13, 14A, 14B, 15A, 15B, 16A, 16B show vertical cross sections of integrated circuit structures according to embodiments of the present invention.

FIG. 17 is a perspective view of an integrated circuit structure according to an embodiment of the present invention.

FIGS. 18, 19A, 19B, 20A, 20B, 21A, 21B, 22A show vertical cross sections of integrated circuit structures according to embodiments of the present invention.

FIG. 22B is a perspective view of an integrated circuit structure according to an embodiment of the present invention.

FIGS. 23A, 23B, 24A, 24B show vertical cross sections of integrated circuit structures according to embodiments of the present invention.

FIGS. 27A, 27B, 28, 29A, 29B, 30, 31, 32A, 32B, 33A, 33B, 34, 35A, 35B, 36A, 36B, 37A–37D show vertical cross sections of integrated circuit structures according to embodiments of the present invention.

FIG. 37E is a top views of an integrated circuit structure according to an embodiment of the present invention.

DESCRIPTION OF SOME EMBODIMENTS

The embodiments described in this section illustrate but do not limit the invention. The invention is not limited to particular materials, process steps, or dimensions. The invention is defined by the appended claims.

Figure 10A:
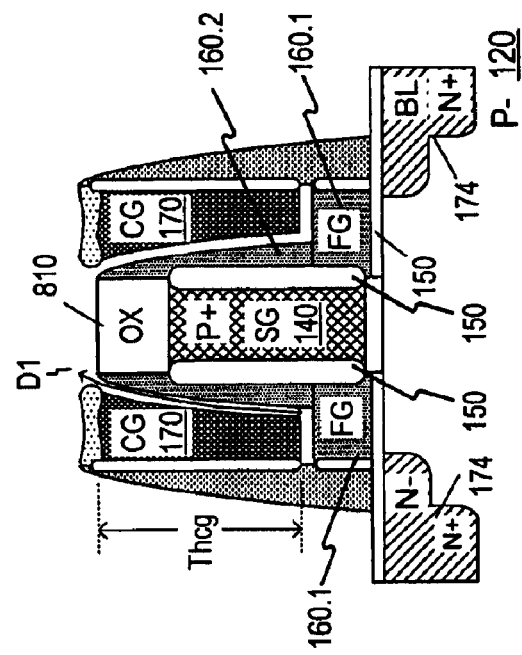
FIGS. 10A, 10B show cross sections of memory cells according to one embodiment of the present invention.

FIG.10A shows a cross section of a memory cell according to one embodiment of the present invention. The cell has two floating gates formed from two layers 160.1, 160.2. Select gate 140 is formed before the floating gates. Then layer 160.1 is formed. Then layer 160.2 is formed and etched to provide a spacer over a sidewall of select gate 140. In some embodiments, layer 160.2 is etched anisotropically without a mask over the memory cell.

We will sometimes refer to the combination of layers 160.1, 160.2 as layer 160. Layers 160.1, 160.2 are sub-layers of layer 160.

Figure 10B:
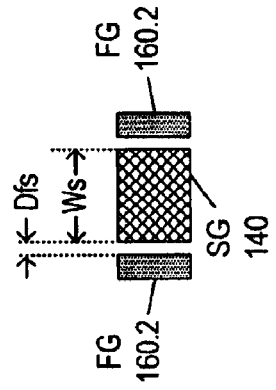

Dielectric 164 insulates the floating gates from control gates 170. FIG. 10B shows the memory cell with dielectric 164 removed to emphasize the overlap D1 between the control gate 170 and the corresponding spacer 160.2. This overlap increases the gate coupling ratio. The overlap D1 can be increased by increasing the thickness of control gate 170 and the overall thickness of the structure consisting of select gate 140 and dielectric 810 on top of the select gate. The gate coupling ratio can thus be increased without increasing the cell area. In FIGS. 10A, 10B, the overlap D1 is larger than the thickness Thcg of control gate 170 due to the inclined shape of the surface of spacer 160.2. In some embodiments, the overlap D1 is at least 500 Å.

Figure 10C:
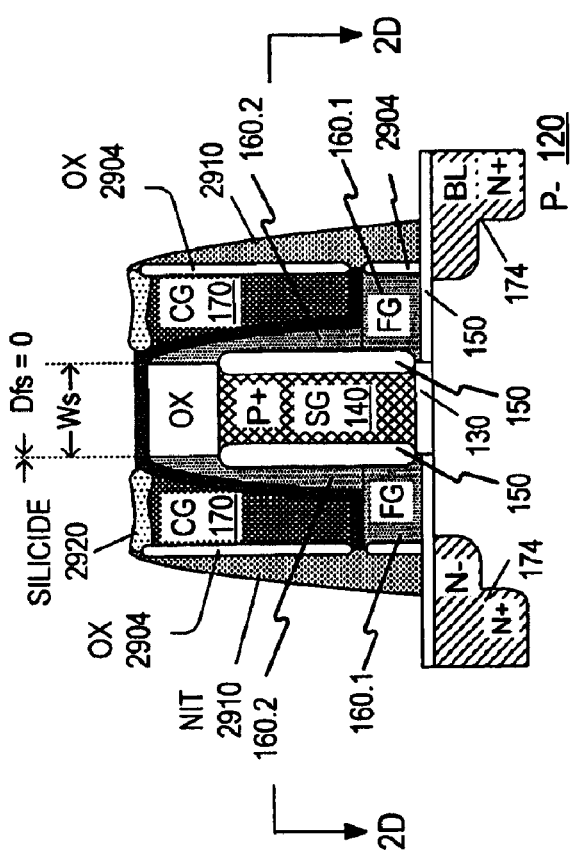
FIG. 10C is a top view of some features shown in FIG. 10A.

FIG. 10C is the top view of select gate 140 and floating gate spacers 160.2. The select gate width is shown as Ws. The distance between each spacer 160.2 and select gate 140 is marked Dfs. As seen in FIG. 10A, the top right corner of spacer 160.2 is directly above the left edge of select gate 140, so Dfs=0. In some embodiments, Dfs>0. In some embodiments, 0<Dfs<Ws.

Figure 10D:
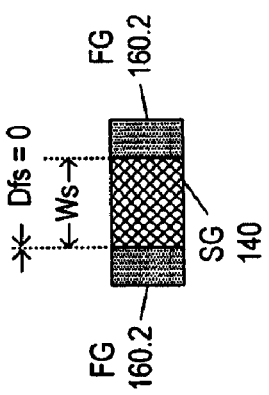
FIG. 10D shows a horizontal cross section of some features shown in FIG. 10A.

FIG. 10D shows a horizontal cross section along the line 2D—2D in FIG. 10A. In this cross section, the distance Dfs between each spacer 160.2 and select gate 140 is determined by the thickness of dielectric 150 on the sidewall of select gate 140. (The dielectric on the sidewalls of select gate 140 and the tunnel oxide on substrate 120 are formed simultaneously and denoted by the same reference number 150.) In some embodiments, Dfs is smaller than Ws in this cross section, as well as in any horizontal cross section by a plane passing through the select gate 140 and the spacers 160.2. In one embodiment, the minimum feature size is 0.1 µm, Ws=0.18 µm, and Dfs is in the range of 0 to 400 Å. In the horizontal cross sections passing through the select gate 140, Dfs is 200 Å to 400 Å. The invention is not limited to these dimensions and relationships.

In FIG. 10A, each control gate 170 overlies the portion 160.1 of the corresponding floating gate. The top of control gate 170 is at about the same level as the top of spacer 160.2. In other embodiments, the top of control gate 170 is higher than the top of spacer 160.2, or is lower than the top of spacer 160.2. Also, in FIG. 10A, the top of spacer 160.2 is higher than the select gate 140, but in other embodiments the top of spacer 160.2 is at the same level as, or lower than, the top of select gate 140.

One embodiment of the invention will now be described on the example of the memory array of FIG. 11. In this example, the array has 4 rows and 5 columns, but any number of rows and columns can be present. FIG. 12A is a top view of the array. FIG. 12B is a perspective view. Each cell 110 has two FG/CG stacks per one select gate 140. Conductive select gate lines 140 and conductive control gate lines 170 run through the memory array in the Y direction (row direction). Each row includes one select gate line 140 and two control gate lines 170. The line 140 provides the select gates for that row of cells. One of the lines 170 provides the control gates for the bits 110L in that row, and the other line 170 provides the control gates for the bits 110R. Bitlines 180 (marked BL0–BL5 for rows 0–5) run in the X direction (column direction). The bitlines contact the corresponding source/drain regions 174 ("bitline regions") in areas 174C (FIG. 12A) marked with a cross. Floating gates 160 are marked with dashed crosses in FIG. 12A. The floating gates can be completely self-aligned (i.e. defined independently of photolithographic alignment), as described below.

Substrate isolation trenches 220T run through the array in the X direction. Trenches 220T are filled with dielectric 220 (field isolation). Active areas 222 run through the array between the trenches 220T. Each active area 222 includes active areas of individual cells in one memory column. The active area of each cell consists of the cell's source/drain regions 174 and the P type channel region extending between the regions 174.

In each column, each two consecutive memory cells have their adjacent source/drain regions 174 merged into a single contiguous region (referenced by the same numeral 174). Each such region 174 provides the source/drain regions to only two of the memory cells in each column. In each column 1–4 (each column except the first column and the last column), each source/drain region 174 is connected to a source/drain region 174 of an adjacent column. The connections alternate, e.g. one source/drain region 174 in column 1 is connected to a source/drain region 174 in column 0, the next region 174 in column 1 is connected to region 174 in column 2, the next region 174 in column 1 is connected to region 174 in column 0, and so on. Bitline BL1 (column 1) is connected to those regions 174 of column 1 that are connected to column 0; bitline BL2 is connected to those regions 174 in column 1 that are connected to column 2, and so on. Bitlines BL0 and BL5 are each connected to only one column. In some embodiments, these two bitlines are shorted together.

As shown in FIG. 12A, the source/drain regions 174 of each column are separated from the source/drain regions 174 in the adjacent columns by field isolation regions 220.

Some of the figures below illustrate vertical cross sections of intermediate structures obtained during the memory fabrication. The sectional planes are indicated in FIG. 12A by lines X1–X1', X2–X2', Y1–Y1', and Y2–Y2'. The line X1–X1' runs in the X direction through floating gates 160 (through an active area 222). The line X2–X2'0 runs in the X direction between the floating gates (through a trench 220T). The line Y1–Y1' runs in the Y direction through a select gate line 140. The line Y2–Y2' runs in the Y direction through a control gate line 170 and floating gates 160.

In one embodiment, the memory is fabricated as follows. Substrate isolation regions 220 are formed in P doped substrate 120 by shallow trench isolation technology ("STI"). See FIG. 13 (cross section Y1–Y1'). Each region 220 is a dielectric region formed in a trench 220T. Suitable STI processes are described in U.S. Pat. No. 6,355,524 issued Mar. 12, 2002 to Tuan et al.; U.S. patent application Ser. No. 10/262,785 filed Oct. 1, 2002 by Yi Ding; and U.S. patent application Ser. No. 10/266,378 filed Oct. 7, 2002 by C. Hsiao, all incorporated herein by reference. Other STI and non-STI processes are also possible. Dielectric 220 is sometimes called "STI oxide" hereinbelow because it is silicon dioxide in some embodiments. The invention is not limited to such embodiments or to silicon integrated circuits.

Substrate isolation regions are also formed in the memory peripheral area (not shown in FIG. 13). The peripheral area contains circuitry needed to access the memory, and may also contain unrelated circuitry (the memory may be embedded into a larger system).

As shown in FIG. 13, oxide 220 protrudes above the substrate 120. The protruding portions are shown at 220P. An exemplary thickness of portions 220P is 0.12 $\mu$m for a 0.18 $\mu$m fabrication process (a process with a 0.18 $\mu$m minimum line width). The exemplary dimensions given in this section assume a 0.18 $\mu$m fabrication process unless mentioned otherwise.

Dopant is implanted into substrate 120 to form an N type region 604 underlying the memory array. Dopant is also implanted into the substrate around the array to form a surrounding N type region (not shown) extending from the top surface of substrate 120 down to region 604. These implants create a fully isolated P well 120W for the memory array. Region 604 is not shown in the subsequent drawings, and the P well 120W is shown simply as substrate 120.

Ion implantation steps ("Vt adjust implants") may be performed into the active areas of substrate 120 to adjust the transistor threshold voltages as needed. One such implant is an N type implant (e.g. arsenic) performed into the array to reduce the threshold voltage of the select gate transistors. This implant creates a counterdoped region 230 at the surface of substrate 120. Region 230 may remain type P, but the net P type dopant concentration in this region is reduced. Region 230 is not shown in some of the drawings.

In some embodiments, region 230 becomes N type in this counterdoping step.

Silicon dioxide 130 (FIG. 14A, cross section Y1–Y1', and FIG. 14B, periphery) is thermally grown on the exposed areas of substrate 120 to provide gate dielectric for the select gates of the memory array and for the peripheral transistors. An exemplary thickness of oxide 130 in the array area is 120 Å. Generally, the oxide thickness depends on the maximum voltage that the oxide 130 is designed to sustain during the memory operation. Oxide 130 can be nitrided when it is being grown, or after it has been grown, to impede boron diffusion from floating gates 160 into substrate 120.

In the example shown in FIG. 14B, the peripheral area includes a high voltage transistor area 512H and a low voltage transistor area 512L. Oxide 130 is grown thermally to a thickness of 60 Å over the entire wafer. This oxide is removed from the low voltage area 512L by a masked etch. The wafer is re-oxidized to re-grow silicon dioxide in area 512L to a thickness of 60 Å. The oxide thickness in the memory array area and in high voltage area 512H increases from 60 Å to 120 Å during this step.

Thus, oxide 130 in the array area and oxide 130 in the high voltage peripheral area 512H is formed simultaneously in these two oxidation steps. All of oxide 130 in area 512L and part of the oxide 130 in the array area and area 512H are formed simultaneously in the second oxidation step.

As shown in FIG. 15A (cross section Y1–Y1') and FIG. 15B (periphery), intrinsic polysilicon layer 140 is formed over the structure by a conformal deposition process (e.g. low pressure chemical vapor deposition, "LPCVD"). Polysilicon 140 fills the spaces between the oxide protrusions 220P in the memory array area. The top polysilicon surface is planar because the polysilicon portions deposited on the sidewalls of protrusions 220P meet together.

FIG. 15B may represent either the low voltage or the high voltage transistor area. In some embodiments, there are more than two peripheral areas with different gate oxide thicknesses, and FIG. 15B may represent any of these areas.

Polysilicon 140 covers the regions 120$i$ (FIG. 15B) at the interface between substrate 120 and field oxide 220 in the peripheral area. Polysilicon 140 will protect the oxide 220 in this area to prevent formation of grooves ("divots") during subsequent processing. Polysilicon 140 will be used to form the peripheral transistor gates. The grooving in regions 120$i$ under the transistor gates is undesirable because it degrades the transistor characteristics.

Layer 140 can also be formed by non-conformal deposition processes, whether known or to be invented. If the top surface of polysilicon 140 is not planar, it is believed that the polysilicon 140 can be planarized using known techniques (e.g. CMP, or spinning a photoresist layer over the polysilicon 140 and then simultaneously etching the resist and the polysilicon at equal etch rates until all of the photoresist is removed). The bottom surface of polysilicon 140 is non-planar as it goes up and down over the oxide protrusions 220P.

An exemplary final thickness of polysilicon 140 is 0.16 $\mu$m over the active areas.

The peripheral area is masked, and polysilicon 140 is doped P+ in the array area. Polysilicon 140 remains undoped ("INTR", i.e. intrinsic) in the periphery. The peripheral transistor gates will be doped later, with the NMOS gates doped N+ and the PMOS gates P+, to fabricate surface channel transistors in the periphery with appropriate threshold voltages. The invention is not limited to the surface channel transistors or any peripheral processing. In particular, entire polysilicon 140 can be doped N+ or P+ after the deposition or in situ.

Silicon dioxide 810 is deposited on polysilicon 140, by CVD (TEOS) or some other process, to an exemplary thickness of 1500 Å. Layer 810 can also be silicon nitride, silicon oxynitride (SiON), or some other material. Layer 810 is sufficiently thick to withstand subsequent oxide etches (and in particular the etch of STI oxide 220 described below in connection with FIG. 22A) and to protect the select gates 140 from counterdoping during subsequent doping steps.

In some embodiments, the top surface of polysilicon 140 and/or oxide 810 is not planar.

The wafer is coated with a photoresist layer 820. See FIG. 16A, cross section X1–X1', and FIG. 16B, periphery. (FIG. 16B shows only the active area, not the field oxide 220.) Resist 820 is patterned to define the select gate lines 140. The peripheral area is covered by the resist. The memory array geometry is not sensitive to a misalignment between mask 820 and the mask defining the isolation trenches 220T (FIGS. 12A, 13) except possibly at the boundary of the memory array.

Silicon dioxide 810 is etched through the resist openings. The resist is removed, and polysilicon 140 is etched away where exposed by oxide 810. Then the exposed oxide 130 is removed. (In an alternative embodiment, the resist 820 is removed after the etch of polysilicon 140 and/or oxide 130.) The select gate lines are formed as a result. Each select gate 140 will control the conductivity of the underlying portion of the cell's channel region in substrate 120. FIG. 17 is a perspective view of the resulting structure in the array area.

The etch of polysilicon 140 can be a perfectly anisotropic vertical etch. Alternatively, the etch can have a horizontal component to reduce the width Ls (FIG. 16A) of select gate lines 140 (the width Ls is the channel length of the select gate transistor). In one embodiment, a perfectly vertical etch is performed first to remove the exposed portions of layer 140, and then an isotropic etch is performed to reduce the width Ls.

In another embodiment, one or more etching steps are performed as described above to form the lines 140. Then the sidewalls of lines 140 are oxidized. Substrate 120 is also oxidized in this step. The select gate line width Ls is reduced as a result. Then the oxide is removed.

The width Ls can also be reduced by a horizontal etch of layer 810. E.g., if layer 810 is SiON, a dry etch having a horizontal component can be used to pattern this layer.

In another embodiment, the sidewalls of the select gate lines are reacted with some material other than oxygen, with a reaction product forming on the sidewalls. The reaction product is then removed.

The lines 140 can thus be more narrow than the minimal photolithographic line width. The memory packing density is therefore increased.

As shown in FIG. 18 (cross section X1–X1'), the structure is oxidized to grow silicon dioxide 150 on substrate 120 and the sidewall surfaces of polysilicon gates 140 in the array area. Oxide 150 will serve as tunnel oxide on substrate 120, and will provide sidewall insulation for the select gates. The oxide thickness depends on the dopants and dopant concentrations. In some embodiments, oxide 150 is 60 Å to 100 Å thick on substrate 120, and is 300 Å thick on the select gate sidewalls. The peripheral area is covered by oxide 810 (FIG. 15B), and remains substantially unchanged during this step. Oxide 150 can be nitrided to prevent boron diffusion from floating gates 160 into substrate 120 if the floating gates will be doped with boron. In the embodiment being described, the floating gates will be doped P+ to improve the data retention time. (The data retention is improved because the P+ doped polysilicon is a high work function material. See U.S. Pat. No. 6,518,618 issued Feb. 11, 2003 to Fazio et al. and incorporated herein by reference.)

If desired, an additional Vt adjust implant can be performed into the array to adjust the threshold voltage of the floating gate transistors (FG/CG transistors). This implant can be performed either before or after the formation of oxide 150. In one embodiment, the implant is performed after the etch of polysilicon 140 which defines the select gates (FIG. 16A). The implant is performed before the removal of oxide 130 from the FG/CG channel areas. The floating gate transistors can be either enhancement or depletion mode transistors.

Floating gate polysilicon 160.1 (FIG. 19A, cross section X1–X1', and FIG. 19B, periphery) is deposited over the structure, by LPCVD for example, and is doped P+ during or after the deposition. Polysilicon 160.1 is sufficiently thick to ensure that its top surface is at least as high throughout the wafer as the top surface of oxide 810. In the embodiment of FIG. 19A, the top surface of layer 160.1 is planar due to a conformal deposition to a thickness larger than half the distance between the adjacent select gate lines 140. In one embodiment, the distance between select gate lines 140 is 0.8 µm, and the polysilicon 160.1 is more than 0.4 µm thick.

If the top surface of polysilicon 160.1 is not planar, it is planarized by CMP or a suitable etch.

After planarization (if needed), layer 160.1 is etched down without a mask. The etch end point is when STI oxide 220 becomes exposed. FIGS. 20A (cross section X1–X1') and 20B (periphery) show an intermediate stage in this etch, when oxide 810 becomes exposed. At this stage, layer 160.1 has been removed from the periphery. The etch endpoint can be the exposure of oxide 220. See FIGS. 21A (cross section X1–X1') and 21B (cross section Y2–Y2'). The endpoint is well defined if the layer 810 is SiON or silicon nitride, but it is also possible to detect the exposure of oxide 220 if layer 810 is silicon dioxide. Alternatively, the etch can be programmed as a timed etch continuing for a predetermined time after the exposure of layer 810.

FIGS. 21A (cross section X1–X1') and 21B (cross section Y2–Y2') show the array area at the end of the polysilicon etch. The polysilicon has been removed from the top surface of oxide 220. In some embodiments, the final thickness of layer 160.1 is 1200 Å. The etch is selective to oxide 810.

Optionally, a timed etch of oxide 220 is performed to recess the top surface of oxide 220 below the surface of polysilicon 160.1. See FIG. 22A (cross section Y2–Y2') and FIG. 22B (perspective view of the array). This etch will improve the capacitive coupling between the floating and control gates. See the aforementioned U.S. Pat. No. 6,355,524. In the embodiment of FIGS. 22A, 22B, the oxide 220 continues to protrude above the top surface of substrate 120 by about 0.10 µm. In other embodiments, the oxide 220 does not protrude above the substrate after the etch (the top surface of layer 220 is level with the top surface of the substrate after the oxide etch).

As mentioned above, layer 810 is sufficiently thick to withstand this etch.

Second polysilicon layer 160.2 (FIG. 23A, cross section X1–X1', and FIG. 23B, periphery) is deposited over the structure. This is a conductive layer, doped during or after deposition to the same conductivity type as layer 160.1. Layer 160.2 is conformal. An exemplary deposition process is LPCVD. An exemplary thickness is 1200 Å.

Figure 24C:
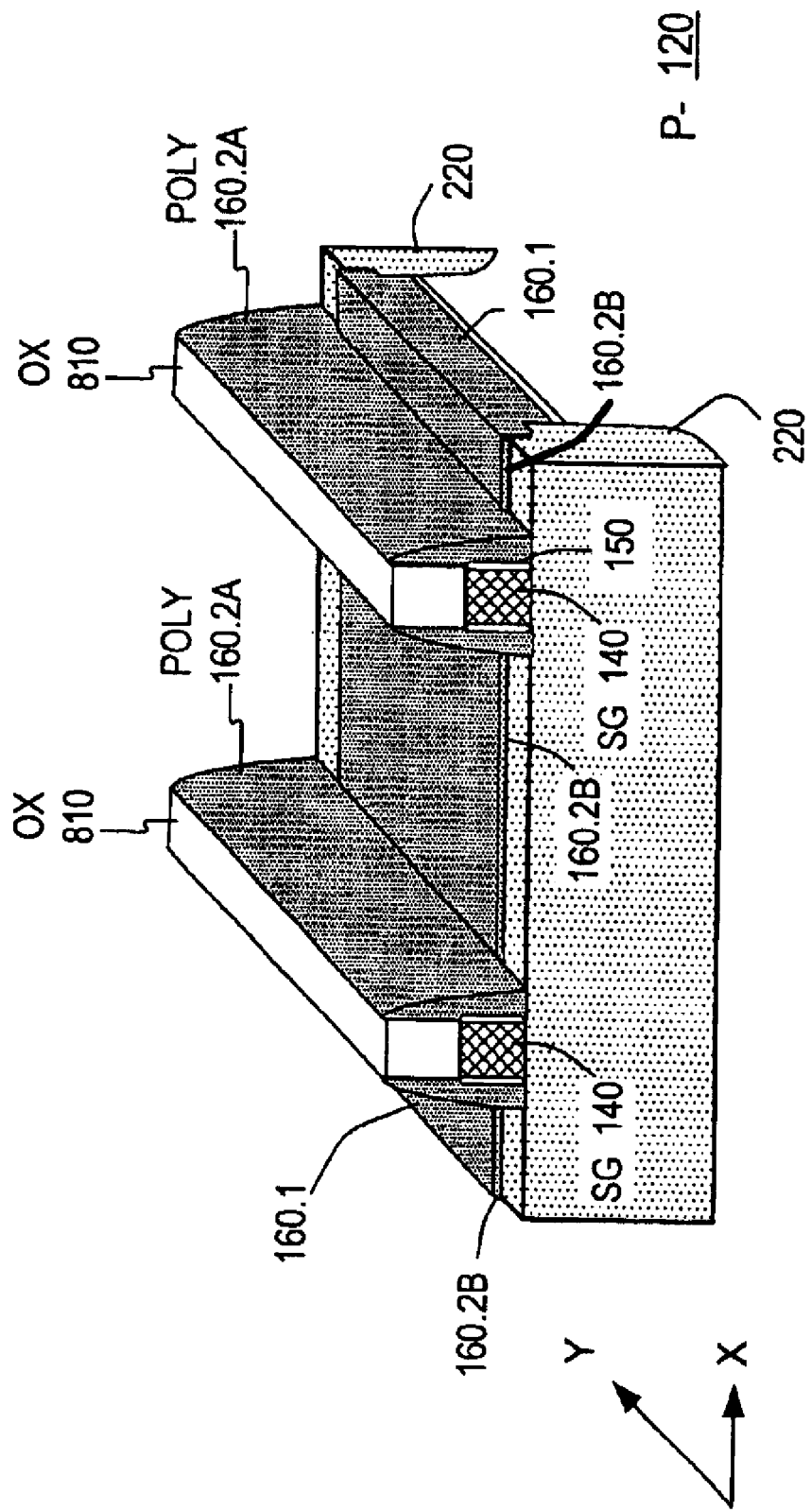
FIG. 24C is a perspective view of an integrated circuit structure according to an embodiment of the present invention.

Polysilicon 160.2 is etched anisotropically, without a mask over the memory array, to form polysilicon spacers 160.2A over the sidewalls of dielectric 150 on select gates 140 and over the sidewalls of oxide layer 810. See FIG. 24A (cross section X–X'), FIG. 24B (periphery) and FIG. 24C (perspective view of the array). The horizontal etch rate may or may not be zero but it is lower than the vertical etch rate. The etch end point is the exposure of oxide 810 and/or trench oxide 220. Due to the etch of oxide 220 described above in connection with FIG. 22A (the etch that recessed the top surface of oxide 220 below the surface of polysilicon 160.1), the etch of polysilicon 160.2 may also form spacers 160.2B (FIG. 22C) on the sidewalls of polysilicon 160.1 near the active areas.

Figure 25:
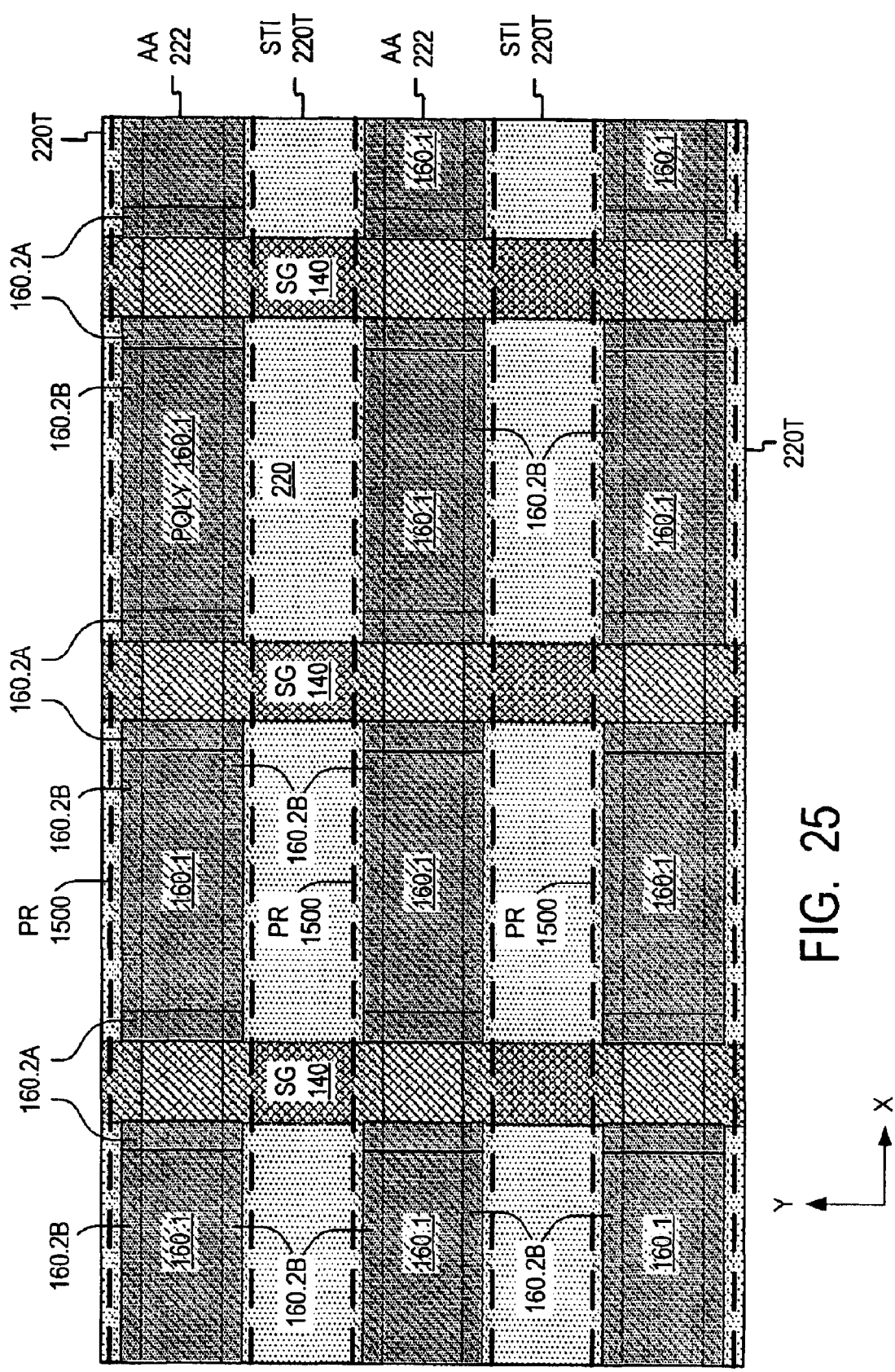
FIG. 25 is a top view of an integrated circuit structure according to an embodiment of the present invention.

A photoresist mask 1500 (FIG. 25, top view) is formed over the memory array active areas to protect the polysilicon 160.1 and portions of polysilicon 160.2A. In FIG. 25, the mask 1500 also covers the polysilicon 160.2B. The mask is patterned as a number of strips. Each strip of resist 1500 runs in the X direction over an active area between two adjacent trenches 220T, and overlaps the trenches to cover the spacers 160.2B.

Polysilicon 160.2A is etched away in the areas exposed by resist 1500. The resist is stripped. The resulting structure is shown in FIG. 25 (top view before stripping of resist 1500) and FIG. 26 (perspective view after the resist stripping). Portions of polysilicon spacers 160.2A are etched away over the isolation trenches 220T. The remaining portions of spacers 160.2A form upward protrusions of the floating gates over sidewalls of select gate lines 140.

Figure 26:
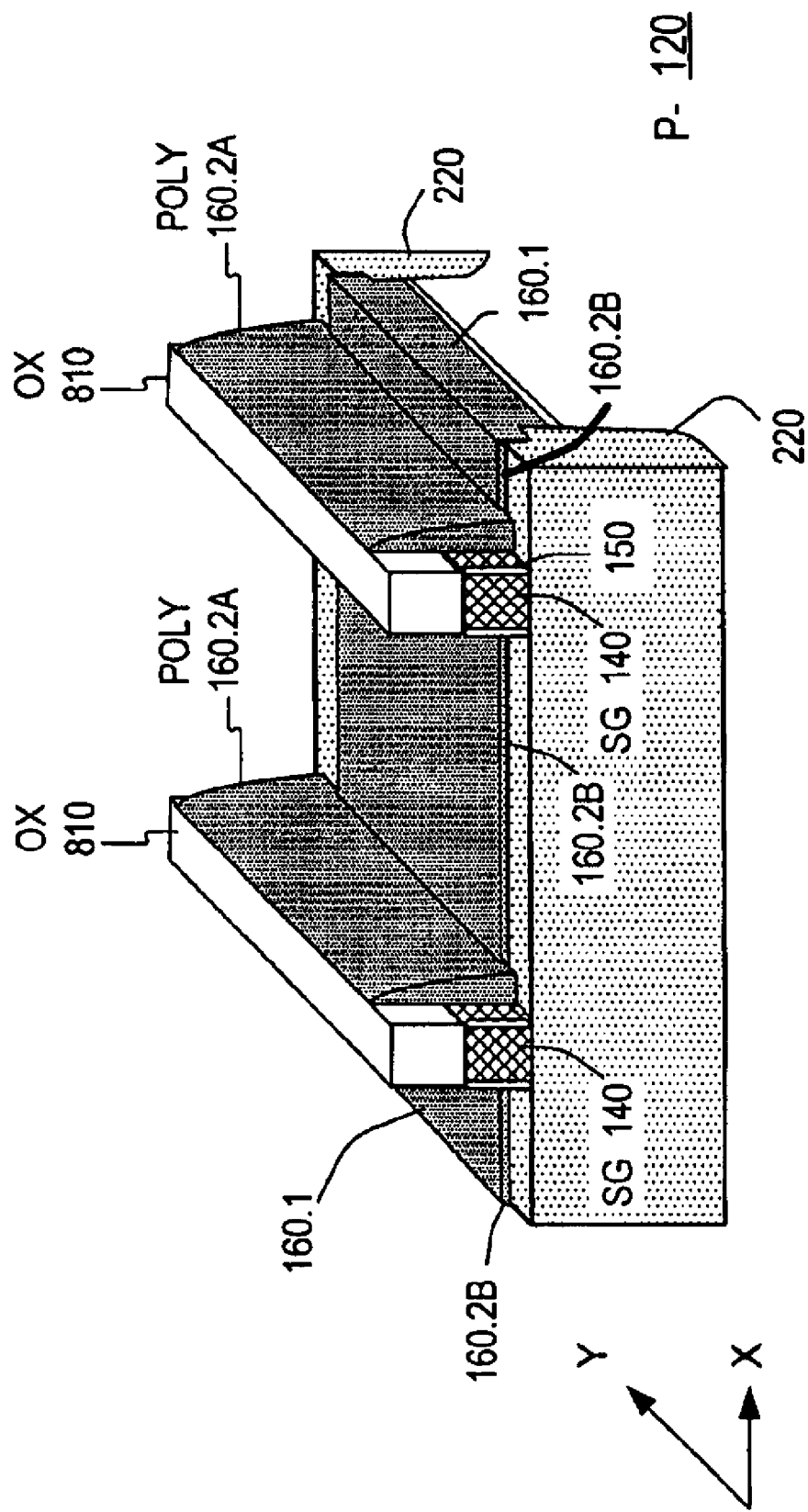
FIG. 26 is a perspective view of an integrated circuit structure according to an embodiment of the present invention.

In the embodiment of FIGS. 25, 26, the resist 1500 covers the spacers 160.2B. Therefore, these spacers are not removed.

If the mask 1500 is shifted in the Y direction, the spacers 160.2B will not be affected as long as they are protected by the mask. The spacers 160.2A will be shifted in the Y direction, but the length of each spacer 160.2A in the Y direction will remain unchanged. The shift of spacers 160.2A is not believed to have a significant effect on the electrical properties of the memory cells.

Spacers 160.2A are marked simply as 160.2 in the subsequent figures.

ONO layer 164 (FIG. 27A, cross section X1–X1', and FIG. 27B, periphery) is formed over the structure. Control gate polysilicon layer 170 is deposited on ONO 164 and is doped during or after the deposition. This layer is doped N+ in the embodiment being described, P+ in other embodiments. This may also be a metal or metal silicide layer, or some other conductive material.

The top surface of polysilicon 170 is not planar in the array area. Layer 170 has protrusions 170.1 over the select gate lines 140. Cavities 170C form in layer 170 between protrusions 170.1 over the future positions of bitline regions 174. The protrusions 170.1 will be used to define the overlap between the floating and control gates without additional dependence on photolithographic alignment.

As shown in FIG. 28 (cross section X1–X1'), a layer 1710 is deposited over the structure and etched without a mask to expose the polysilicon 170. Layer 1710 fills the cavities 170C. When layer 1710 is etched in the array area, layer 1710 is removed in the periphery, so the periphery becomes as in FIG. 27B. In one embodiment, layer 1710 is silicon nitride deposited to have a planar top surface or planarized during the etch.

Polysilicon 170 is etched without a mask. See FIG. 29A (cross section X1–X1') and 29B (periphery). This etch attacks the polysilicon portions 170.1 and exposes ONO 164. Polysilicon 170 is removed from the periphery by this etch. In the array area, polysilicon layer 170 becomes broken over the select gate lines 140. In other words, the polysilicon etch creates a gap 170G (a through hole) in polysilicon layer 170 at each select gate line 140. In the embodiment of FIG. 29A, the etch endpoint is the exposure of ONO 164. In other embodiments, the etch continues after the exposure of ONO 164. In either case, at the conclusion of the polysilicon etch, polysilicon 170 is exposed near the select gates 140 but some of polysilicon 170 is covered by nitride 1710. The width WI of the exposed portions of polysilicon layer 170 adjacent to gaps 170G will define the width of the control and floating gates in a self-aligned manner as illustrated below.

In some embodiments, the minimum thickness of polysilicon 170 (near the gaps 170G) is 0.18 μm, and the width W1 is also 0.18 μm.

In the embodiment of FIG. 29A, the etch of polysilicon 170 is selective to nitride 1710. In other embodiments, the etch is not selective to the nitride, and nitride 1710 is etched at the same rate as the polysilicon. The etch can stop on the top oxide sub-layer of ONO 164. The etch can be replaced with CMP. In some embodiments, the etch or the CMP removes some or all of ONO 164 above the select gates 140 and exposes the oxide 810. In either case, at the conclusion of the etch or the CMP process, polysilicon 170 is exposed near the select gates 140 but some of polysilicon 170 is covered by nitride 1710. The width WI of the exposed polysilicon portions will define the width of the control and floating gates as illustrated below.

A protective layer 1910 (FIG. 30, cross section X1–X1') is formed adjacent to gaps 170G to protect the polysilicon 170 near the select gates 140. In one embodiment, layer 1910 is silicon dioxide formed by thermal oxidation of layer 170. An exemplary thickness of oxide 1910 is 500 Å. Layer 1910 can also be a conductive metal silicide formed selectively on polysilicon 170 by a salicide (self-aligned silicidation) technique. In another embodiment, layer 1910 is deposited over the whole wafer and then removed by CMP from the top surface of layer 1710. See U.S. patent application Ser. No. 10/393,212 filed Mar. 19, 2003 by Yi Ding and incorporated herein by reference.

Nitride 1710 is removed (by a wet etch for example) selectively to oxide 1910. The resulting structure is shown in FIG. 31 (cross section X1–X1'). The periphery remains as in FIG. 29B.

Polysilicon 170, ONO 164, and polysilicon 160 are etched with oxide 1910 as a mask. The resulting structure is shown in FIG. 32A (cross section X1–X1') and FIG. 32B (periphery). In some embodiments, the polysilicon etch of layers 170, 160 is anisotropic, and the etch of ONO 164 is isotropic or anisotropic. The ONO etch may remove the ONO 164 over the select gates 140 and may also remove portions of oxide 1910 and/or oxide 810.

In each FG/CG stack, the floating gate 160 together with control gate 170 control the underlying portion of the cell's channel region.

A photoresist layer (not shown) is formed over the wafer and patterned to cover the array but expose the entire periphery. Then oxide 810 (FIG. 32B) is etched away from the peripheral area.

The resist covering the array is removed, and another photoresist layer (not shown) is formed to cover the array and define the peripheral transistor gates. Polysilicon 140 is etched away where exposed by this resist. See FIG. 33B.

The resist is removed. The wafer is coated with a photoresist layer 2720 (FIG. 33B, periphery). The resist is patterned to expose the entire array area (FIG. 33A, cross section X1–X1') and also to expose the peripheral NMOS transistor regions. FIG. 33B shows a peripheral NMOS transistor region 512N with a P well 2724P, and a peripheral PMOS transistor region 512P with an N well 2724N. These wells were defined before formation of oxide 130. There can be many regions 512N, 512P in the integrated circuit. Resist 2720 covers the PMOS transistor regions 512P. An N type implant (N–) is performed to form the LDD (lightly doped drain) extensions for peripheral NMOS source/drain regions 2730N. This implant also dopes the NMOS gates 140 in the periphery. In addition, the implant dopes bitline regions 174 (FIG. 33A).

In other embodiments, resist 2720 covers the memory array, and no doping is performed in the bitline regions at this step.

Resist 2720 is removed, and another photoresist layer 2820 (FIG. 34, periphery) is formed to cover the NMOS peripheral transistor regions 512N and the memory array. A P type implant (P–) is performed to form the LDD extensions for PMOS source/drain regions 2730P and to dope the peripheral PMOS transistor gates.

Resist 2820 is removed. A thin silicon dioxide layer 2904 (FIG. 35A, cross section X1–X1', and FIG. 35B, periphery) is grown on the exposed silicon surfaces of layers 140, 160, 170 by a rapid thermal oxidation process (RTO). Alternative techniques can also be used such as chemical vapor deposition (e.g. TEOS CVD), a high temperature oxide process (HTO), or other suitable techniques, known or to be invented. These techniques may form the oxide 2904 over the entire structure and not only on the silicon surfaces. An exemplary thickness of oxide 2904 is 100 Å.

A silicon nitride layer 2910 is deposited to an exemplary thickness of 500 Å to 800 Å. Layer 2910 is etched anisotropically without a mask to form sidewall spacers over the gate structures. The etch of nitride 2910 may remove some of oxide 810 in the array area (FIG. 35A). If oxide 2904 was deposited over the entire structure (by TEOS CVD or HTO for example), oxide 2904 will help protect the substrate 120 during the nitride etch.

Then N+ and P+ implants are performed to create source/drain structures for the peripheral transistors and the bitline regions 174. More particularly, the peripheral PMOS transistor area 512P is masked with resist (not shown), and an N+ implant is performed to create the source/drain structures for bitline regions 174 and the peripheral NMOS transistors and increase the dopant concentration in the peripheral NMOS gates 140. The floating, control and select gates and the overlying layers mask this implant so no additional masking in the array area is needed.

The resist is removed. The array and the peripheral NMOS transistor regions 512N are masked with a resist (not shown), and a P+ implant is performed to create the source/drain structures for the peripheral PMOS transistors and increase the dopant concentration in the PMOS transistor gates 140.

The resist is removed. A silicon dioxide etch is performed to remove the oxide 1910 and expose the control gate lines 170 (FIG. 36A, cross section X1–X1'). This etch also removes the exposed portions of oxide 150 over bitline regions 174 in the array area, the exposed oxide 130 over source/drain regions 2730N, 2730P in the periphery (see FIG. 36B), and the oxide 2904 over the peripheral transistor gates.

A conductive metal silicide layer 2920 is formed by a self-aligned silicidation (salicide) process on the exposed silicon surfaces of control gate lines 170, bitline regions 174, peripheral transistor gates 140 and peripheral source/drain regions 2730N, 2730P. The salicide process involves depositing a metal layer, heating the structure to react the metal with the silicon, and removing the unreacted metal. This can be followed by an anneal or any other suitable processing, known or to be invented, to improve the silicide properties (e.g. increase its conductivity). Titanium, cobalt, nickel, and other conductive materials, known or to be invented, can be used for the metal layer. Non-salicide selective deposition techniques, known or to be invented, that selectively form a conductive layer 2920 on the exposed silicon but not on a non-silicon'surface, can also be used. Silicide 2920 has a lower resistivity and a lower sheet resistance than polysilicon 170.

As noted above in connection with FIG. 30, layer 1910 can be a conductive metal silicide formed by a salicide process. In this case, layer 1910 does not have to be removed. The silicidation process of FIG. 36A will silicide the bitline regions 174, the peripheral gates 140 and the peripheral source/drainer regions 2730.

As shown in FIG. 37A (cross section X1–X1'), FIG. 37B (array boundary or an array gap without floating gates), and FIGS. 37C and 37D (periphery), inter-level dielectric 3204 is deposited over the wafer. FIG. 37C shows only an NMOS transistor region, but the PMOS regions are similar. Contact openings are etched in dielectric 3204 to expose the silicided surfaces of bitline regions 174 (FIG. 37A), control gates 170 (FIG. 37B), peripheral source/drain regions 2730N and 2730P (FIGS. 36B, 37C), and peripheral gates 140 (FIG. 37D). The silicide 2920 protects the bitline regions 174 and the source/drain regions 2730 during this etch. A conductive layer 3210 (e.g. metal) is deposited and patterned to contact the silicided regions. The figures also show an optional metal layer 3220 (e.g. tungsten) used to fill the contact openings before the deposition of layer 3210.

Figure 11:
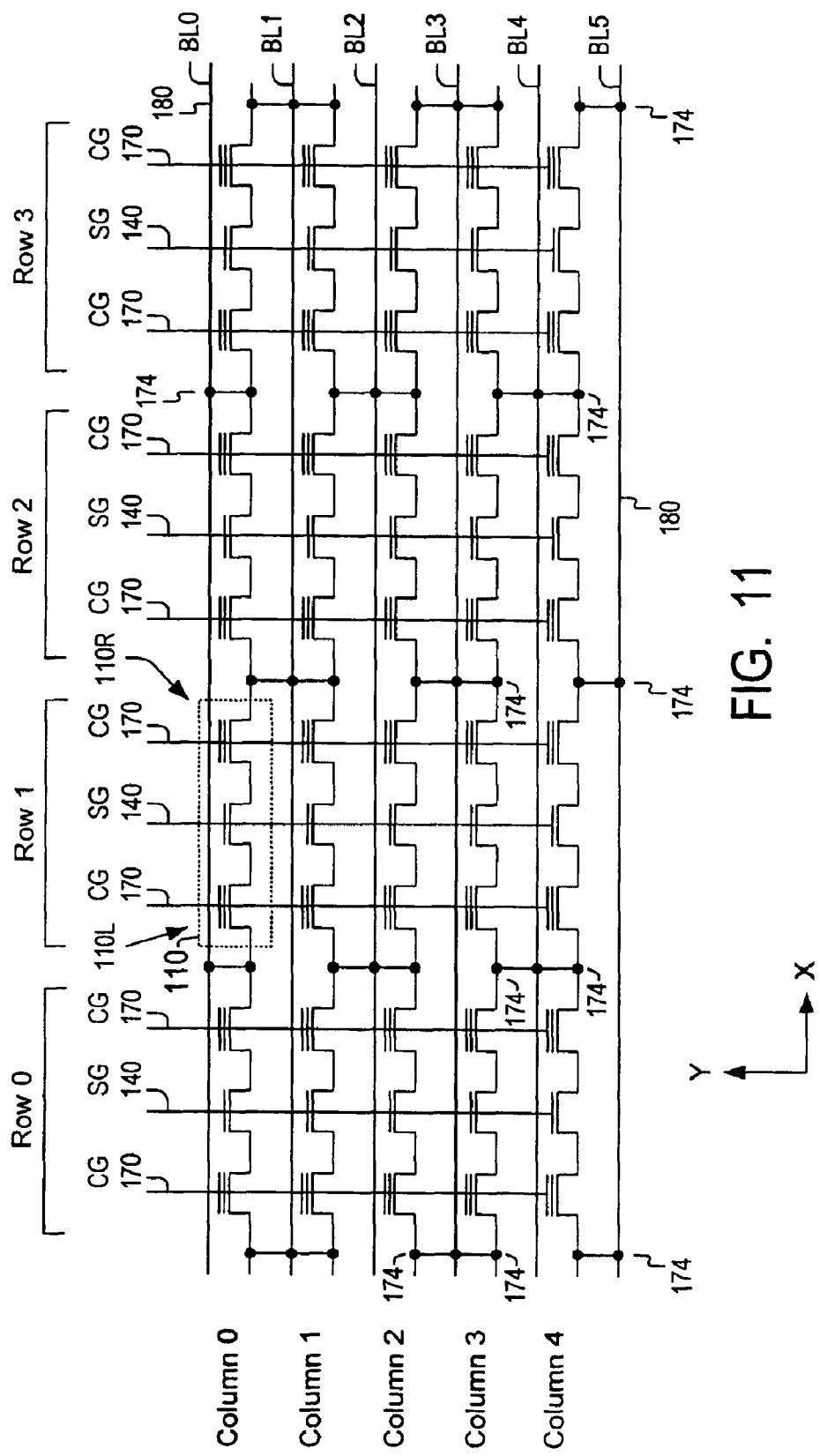
FIG. 11 is a circuit diagram of a memory array according to an embodiment of the present invention.
Figure 12A:
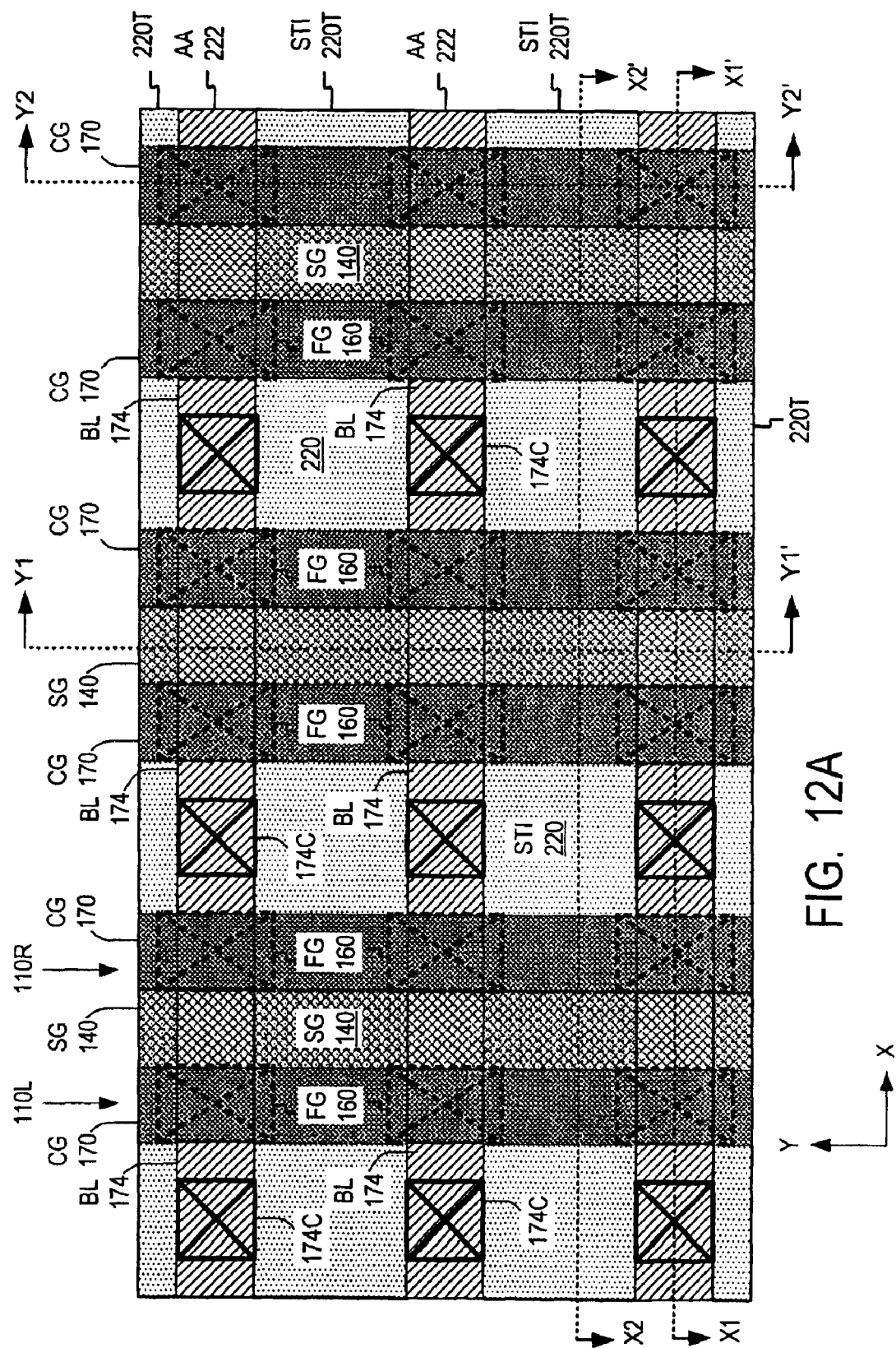
FIG. 12A is a top view of a memory array according to an embodiment of the present invention.
Figure 12B:
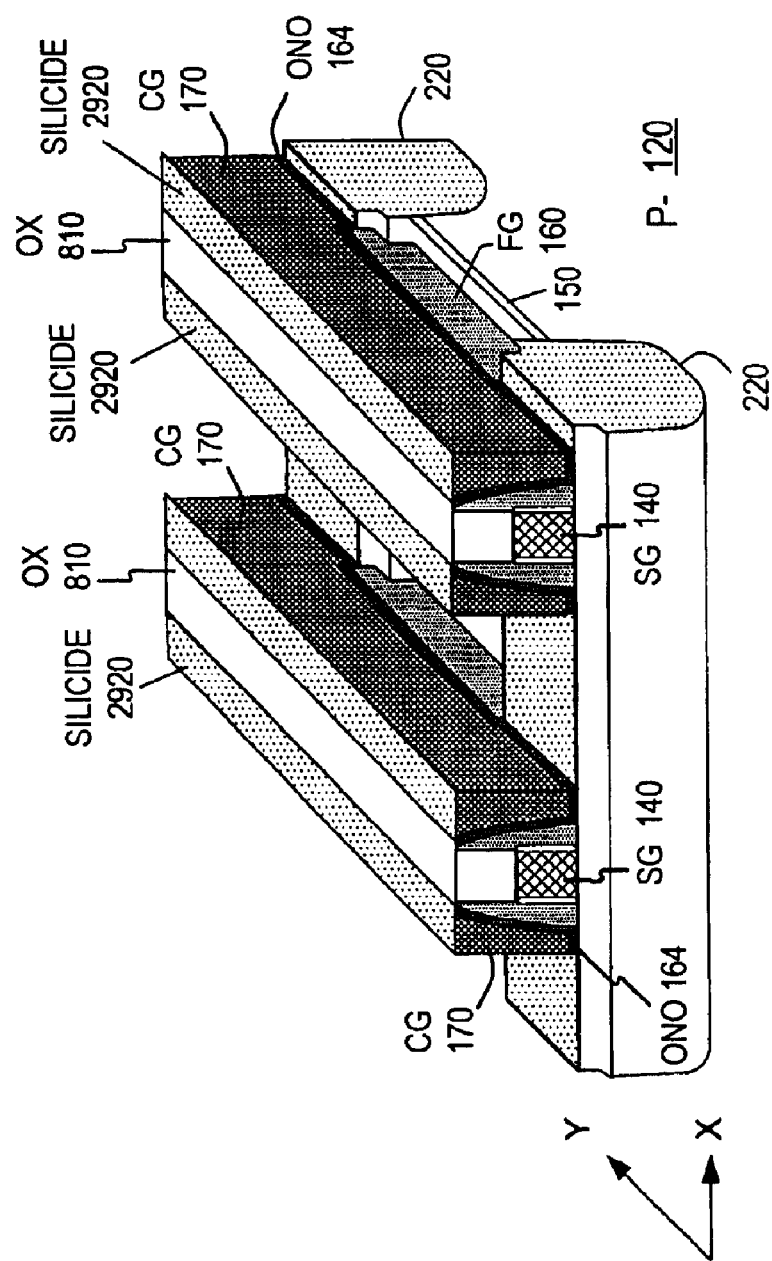
FIG. 12B is a perspective view showing some features of the memory of FIG. 12A.

In the embodiment of FIG. 37A, metal 3210 is used to form jumpers between the adjacent bitline regions 174 connected together (see FIG. 11). Then another dielectric layer 3230 (not shown in FIGS. 37B–37D) is deposited, contact openings are etched in this layer to jumpers 3210, and another metal layer 3240 is deposited on top and patterned to form the bitlines 180. The bitlines contact the bitline regions 174 through the jumpers made from metal 3210. The openings in layer 3240 are filled with optional tungsten plugs 3250 before the metal 3240 is deposited.

FIG. 37E (top view) shows an extension of a peripheral transistor gate 140 over STI oxide 220. The extension can be made to form a contact to the gate or for some other reason (e.g. to connect the gate to other features). The region 120i at the interface between the substrate 120 and field oxide 220 is protected from the divot formation because the gate is formed using the first polysilicon layer 140. See also FIG. 15B. The transistor of FIG. 37E can be a high voltage transistor (in area 512H in FIG. 14B) or a low voltage transistor (in area 512L).

In FIG. 36A, the width of select gate 140 is shown as Ls, and the width of each of floating gates 160 is shown as Lf. The floating gate width Lf is defined by the parameter W1 (FIG. 29A) in a self-aligned manner, so Lf can be smaller than the minimal photolithographic line width. Ls can also be smaller than the minimal photolithographic line width as explained above in connection with FIG. 16A. Ls can be smaller than Lf, or can be equal to or larger than Lf.

In each bit of the memory cell, ONO layer 164 forms a continuous feature overlying the respective floating gate and overlaying a sidewall of select gate line 140. This feature extends the whole length of the select gate line 140 (in the Y direction). Control gate 170 overlies the continuous feature of ONO 164. The portion of ONO 164 overlaying the sidewall of select gate line 140 separates the control gate 170 from the select gate 140.

Other details of the memory fabrication process for one embodiment are given in U.S. patent application Ser. No. 10/393,212 "NONVOLATILE MEMORIES AND METHODS OF FABRICATION" filed Mar. 19, 2003, and U.S. patent application Ser. No. 10/411,813 filed by Yi Ding on Apr. 10. 2003, both incorporated herein by reference.

Figure 38:
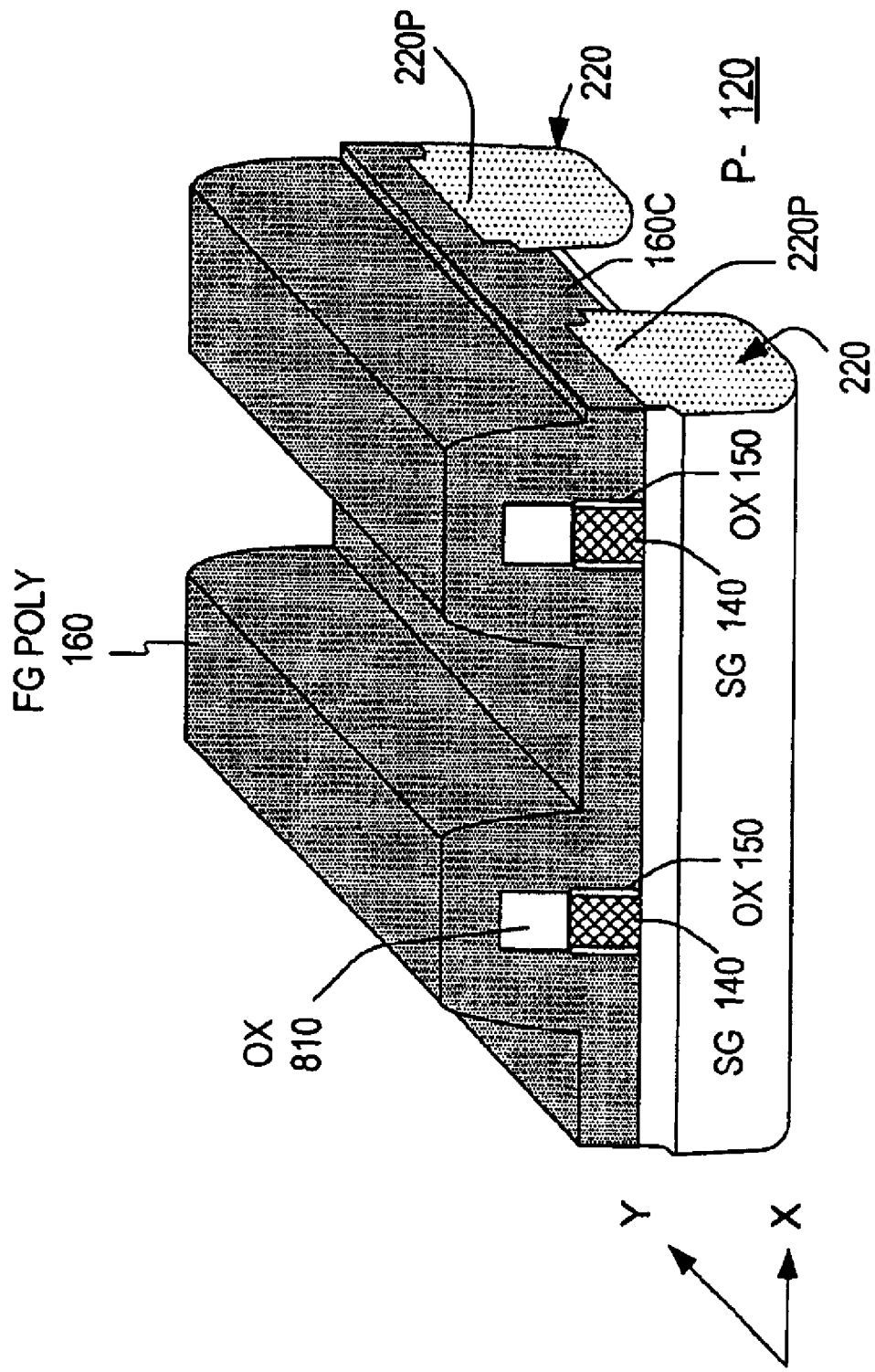
FIGS. 38, 39, 40 are perspective views of integrated circuit structures according to embodiments of the present invention.

In FIG. 38, the floating gates are fabricated using a single polysilicon layer 160. The wafer is processed through the stage of FIG. 18, then the polysilicon 160 is deposited and suitably doped. An exemplary thickness of polysilicon 160 is 1600 Å. Polysilicon 160 includes portions 160C between the protrusions 220P of substrate isolation regions 220. Portions 160C have a planar top surface. This can be achieved by a conformal deposition of layer 160 (e.g. LPCVD) to a suitable thickness to cause the portions of layer 160 over the sidewalls of protrusions 220P to meet during the deposition. Of note, the polysilicon 160 is thicker at portions 160C than over the oxide 220P.

Figure 39:
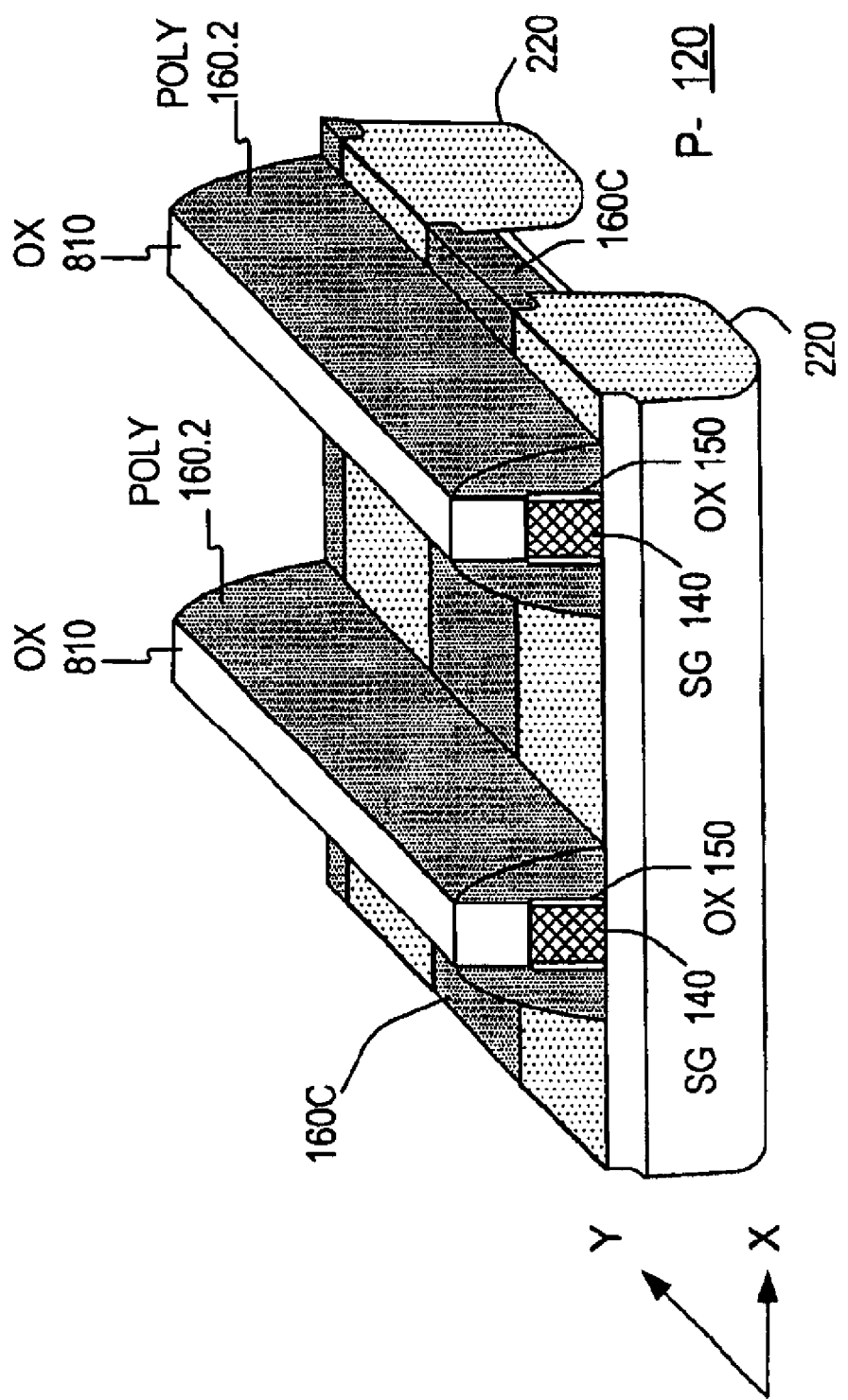

Polysilicon 160 is etched anisotropically, without a mask over the memory array, to form polysilicon spacers 160.2 (FIG. 39) over dielectric sidewalls 150, 810. The etch end point is the exposure of oxide 810 and trench oxide 220. Polysilicon is etched off the top surface of substrate isolation oxide 220. Polysilicon portions 160C are etched down, and their top surface becomes level with the top surface of oxide 220.

Figure 40:
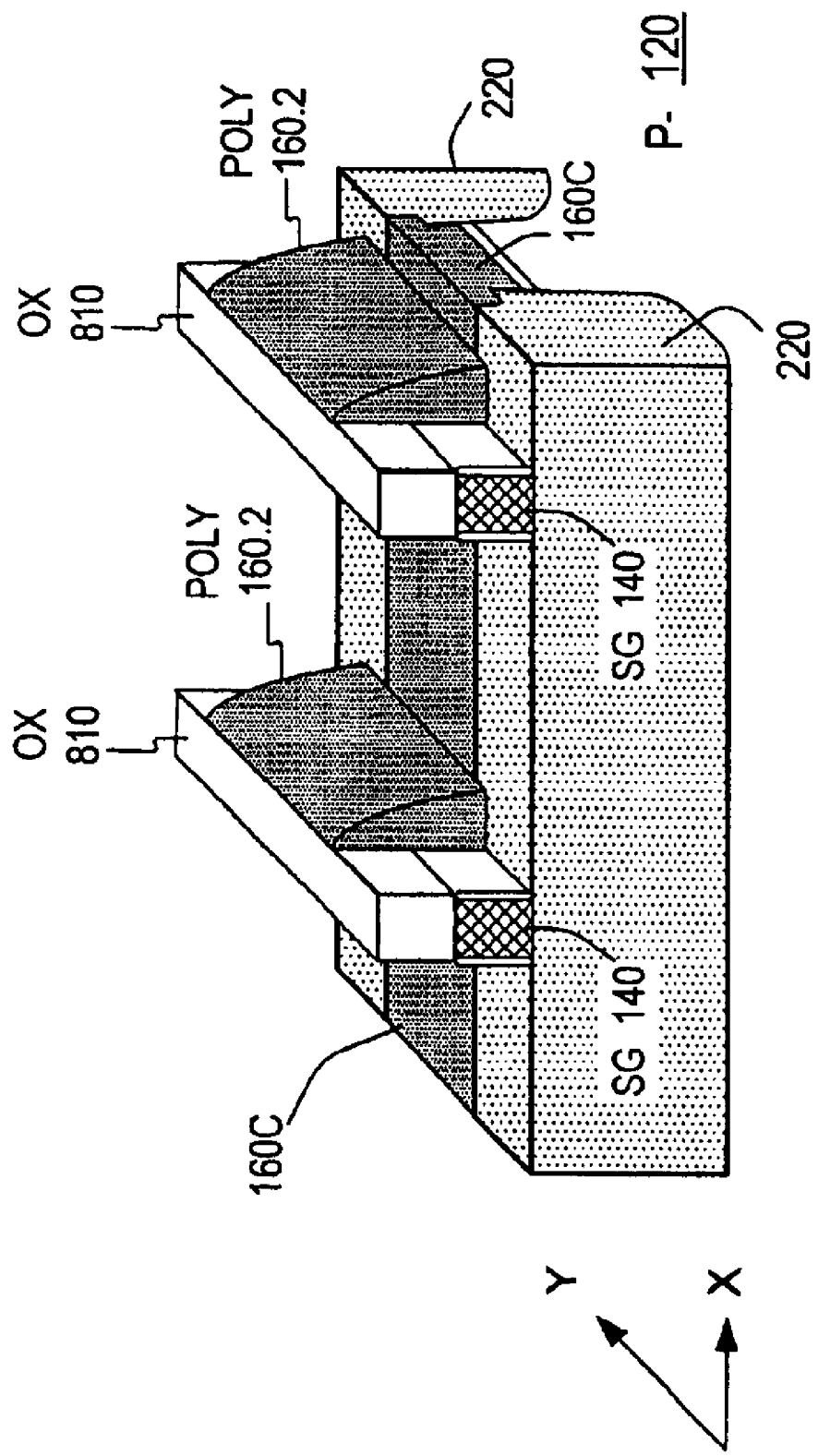

Then mask 1500 is formed as shown in FIG. 25. The exposed portions of polysilicon spacers 160.2 are removed. The resulting structure is shown in FIG. 40.

The remaining fabrication steps can be as described above.

Figure 41:
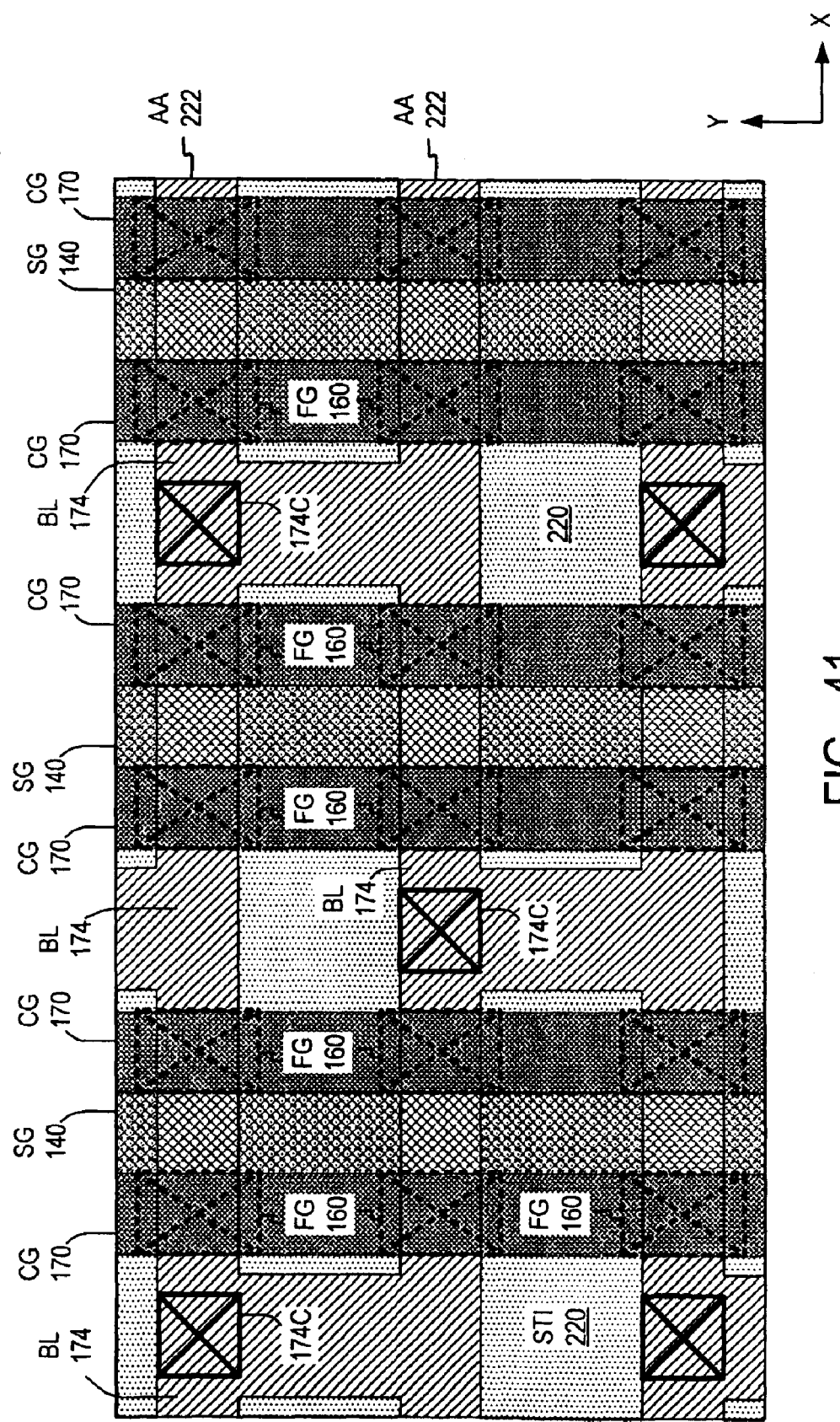
FIG. 41 is a top view of an integrated circuit structure according to an embodiment of the present invention.

FIG. 41 shows an alternative layout of the array. Here the connection between the source/drain regions 174 in the adjacent columns is done through the substrate 120. Each contiguous N+ type region 174 provides two source/drain regions for one of the two adjacent columns and also provides two source/drain regions 174 for the other one of the adjacent columns. In the first and last rows of the array, each region 174 provides one source/drain region for each of the two adjacent columns. Jumpers made from layer 3210 of FIG. 37A are unnecessary. Layer 3210 can be used to form the bitlines 180. The number of bitline contact openings 174C can be reduced, because only one contact is needed for each pair of source/drain regions 174 that are shorted together. Other layouts are also possible.

Figure 1:
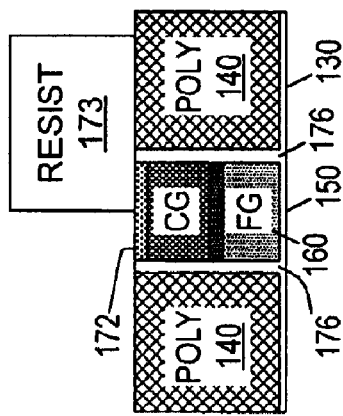
FIGS. 1–9 shows vertical cross sections of prior art memory cells and intermediate structures obtained in prior art fabrication processes.
Figure 2:
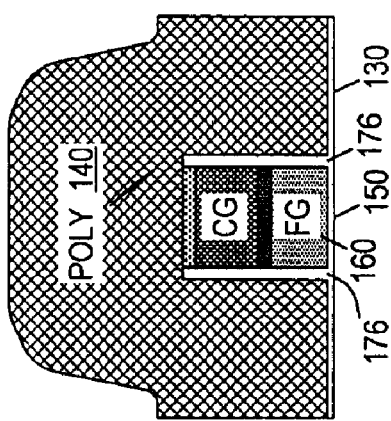
Figure 3:
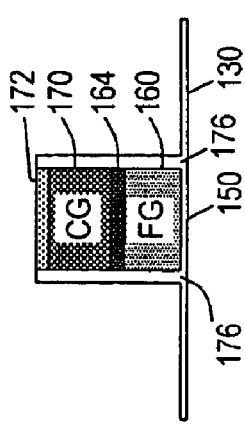
Figure 5:
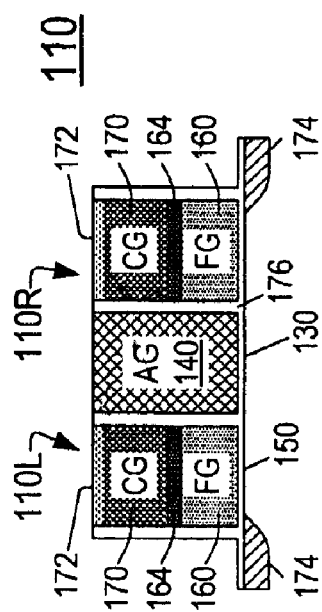
Figure 4:
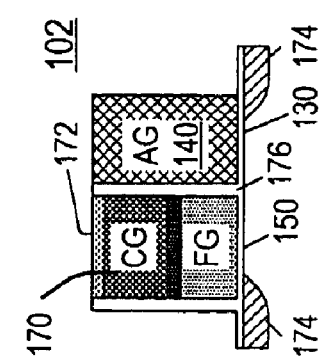
Figure 6:
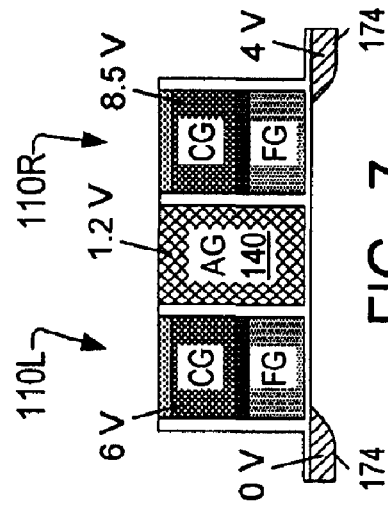
Figure 7:
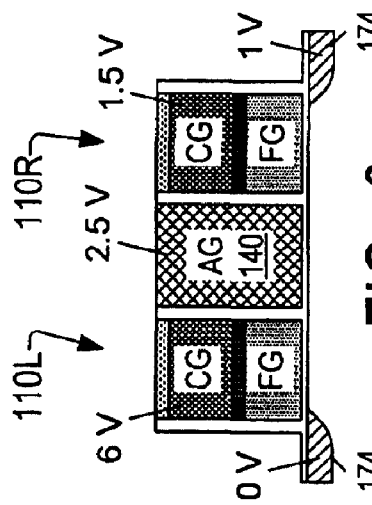
Figure 8:
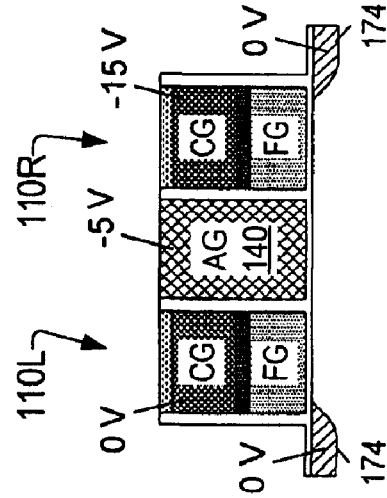
Figure 9:
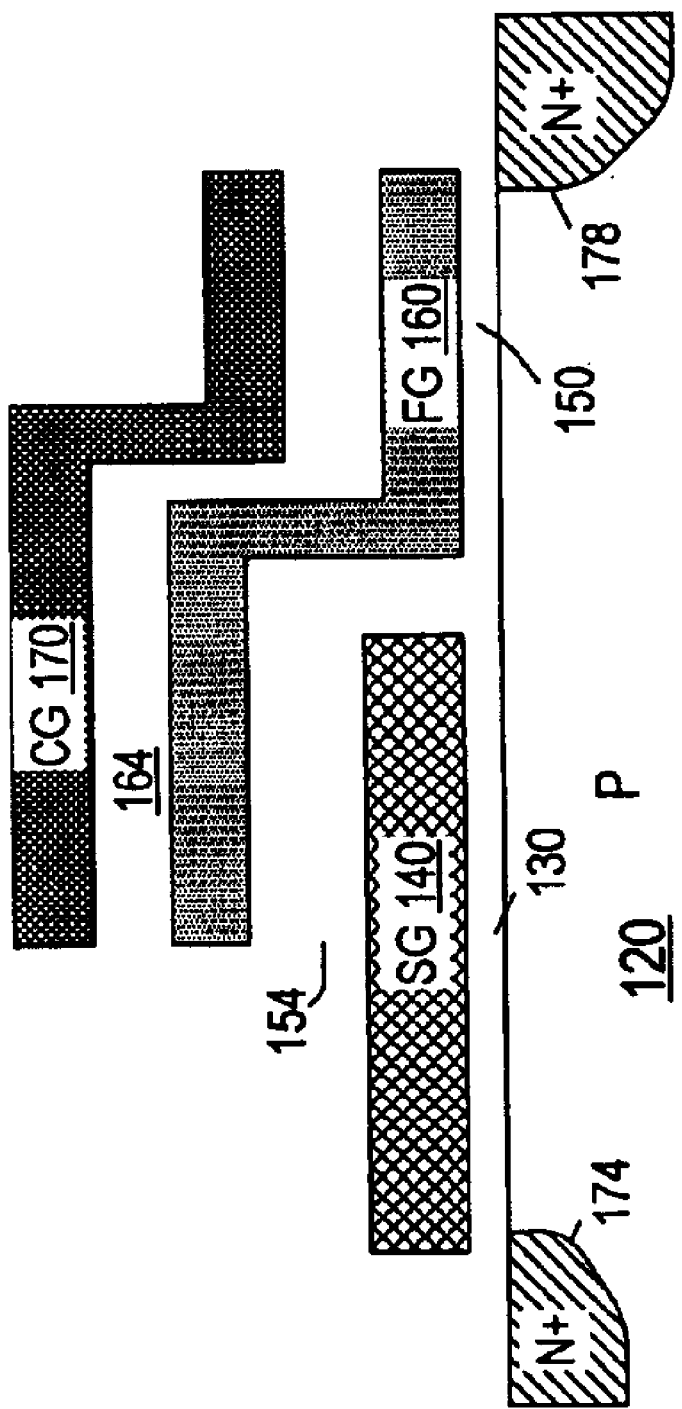

In some embodiments, the memory cells are read, programmed and erased using the same voltages and mechanisms as the cell of FIG. 5. The programming is done by channel hot electro ejection (CHIE) or Fowler-Nordheim tunneling. The voltages can be as in FIGS. 6–8. Other exemplary voltages are shown in the following Table 1:

TABLE 1

|  | Read | Program (CHEI) | Erase |
| --- | --- | --- | --- |
| Select gate 140 |  |  |  |
| Selected row: | 2.5 V | 1.5 V | 2 V |
| Unselected row: | 0 V | 0 V | 0 V |
| Control gate 170 |  |  |  |
| Selected row: |  |  |  |
| Selected bit (Left or Right): | 1.5 V to 2 V | 9 V to 10 V | −9 V to −10 V |
| Unselected bit: | 7 V to 7.5 V | 7 V to 7.5 V | 0 V |
| Unselected row: | 0 V | 0 V | 0 V |
| Bitline 180 |  |  |  |
| Selected column: |  |  |  |
| Selected bit: | 1.5 V | 4.5 V to 5 V | Floating |
| Unselected bit: | 0 V | 0 V | 0 V |
| Unselected column: | 0 V | 0 V | 0 V |
| Substrate 120: | 0 V | 0 V | 7 V to 8 V |

The erase operation is through the channel region in substrate 120 (bulk erase). In other embodiments, the memory is erased through a source/drain region 174. The programming can be performed by Fowler-Nordheim tunneling. In some embodiments, the programming is performed by an electron transfer between floating gate 160 and select gate 140.

The invention is not limited to any particular read, erase or programming techniques, or to particular voltages. For example, the memory can be powered by multiple power supply voltages. Select gates 140 and/or floating gates 160 may be doped N+, and/or may include non-semiconductor materials (e.g. metal silicide). The invention is not limited to the arrays of FIG. 11. Also, substrate isolation regions 220 do not have to traverse the entire array. The invention is applicable to multi-level memory cells (such a cell can store multiple bits of information in each floating gate). Other embodiments and variations are within the scope of the invention, as defined by the appended claims.

What is claimed is:

1. A method for manufacturing an integrated circuit comprising a nonvolatile memory, the method comprising:
    forming a first structure over a semiconductor substrate, the first structure comprising:
        a first conductive gate of a nonvolatile memory cell; and
        a first dielectric over the first conductive gate;
    forming a layer ("FG layer") to provide at least two conductive floating gates for the memory cell, wherein each floating gate comprises a first portion and an upward protruding second portion, the second portion being formed over the first dielectric and overlaying a sidewall of the first conductive gate;
    wherein the memory cell comprises two source/drain regions and a channel region which borders on the source/drain regions, and each floating gate of the memory cell is operable to control a portion of the channel region.

2. The method of claim 1 wherein the FG layer consists of one or more sub-layers all of which are present in both the first and the second portions of the floating gates.

3. The method of claim 1 wherein the memory cell is one of a plurality of the memory cells, and the method further comprises a masked etch of the FG layer to remove portions of the FG layer between different memory cells.

4. The method of claim 1 further comprising forming two second conductive gates for the memory cell, the second conductive gates being insulated from the first conductive gate and the floating gates.

5. The method of claim 4 wherein each floating gate in combination with a respective one of the second conductive gates is operable to control a respective portion of the channel region.

6. The method of claim 1 wherein the at least two floating gates are operable to control respective first and second portions of the channel region, and the first conductive gate is operable to control a third portion of the channel region.

7. The method of claim 1 wherein the first conductive gate is formed before the FG layer.

8. A method for manufacturing an integrated circuit comprising a nonvolatile memory, the method comprising:
forming a first structure over a semiconductor substrate, the first structure comprising:
a first conductive gate of a nonvolatile memory cell; and
a first dielectric over the first conductive gate;
forming a layer ("FG layer") to provide at least two conductive floating gates for the memory cell, wherein each floating gate comprises a first portion and an upward protruding second portion, the second portion being formed over the first dielectric and overlaying a sidewall of the first conductive gate;
wherein the FG layer comprises a first sub-layer and a second sub-layer formed after the first sub-layer, wherein the first portion of each floating gate is formed from the first sub-layer, and the second portion of each floating gate is formed from the second sub-layer.

9. The method of claim 8 wherein forming the FG layer comprises:
forming the first sub-layer to provide the first portions of the floating gates, the first structure protruding above the first sub-layer; and then
forming the second sub-layer layer and etching the second sub-layer to provide the second portions of the floating gates on sidewalls of the first structure.

10. The method of claim 8 wherein the memory cell is one of a plurality of the memory cells, and the method further comprises a masked etch of the FG layer to remove portions of the FG layer between different memory cells.

11. The method of claim 8 further comprising forming two second conductive gates for the memory cell, the second conductive gates being insulated from the first conductive gate and the floating gates.

12. The method of claim 8 wherein the memory cell comprises two source/drain regions and a channel region which borders on the source/drain regions, and each floating gate of the memory cell is operable to control a portion of the channel region.

13. The method of claim 8 further comprising forming two second conductive gates for the memory cell, the second conductive gates being insulated from the first conductive gate and the floating gates, wherein the memory cell comprises two source/drain regions and a channel region which borders on the source/drain regions, and each floating gate in combination with a respective one of the second conductive gates is operable to control a respective portion of the channel region.

14. The method of claim 13 wherein the first conductive gate is operable to control a portion of the channel region between said two respective portions of the channel region.

15. The method of claim 8 wherein the memory cell comprises two source/drain regions and a channel region which borders on the source/drain regions, and each floating gate of the memory cell overlies a portion of the channel region.

16. The method of claim 8 wherein the second portions of at least two floating gates overlay respective two opposite sidewalls of the first conductive gate.

17. The method of claim 8 wherein the first conductive gate is formed before the FG layer.

18. A method for manufacturing an integrated circuit comprising a nonvolatile memory, the method comprising:
forming a first structure over a semiconductor substrate, the first structure comprising:
a first conductive gate of a nonvolatile memory cell; and
a first dielectric over the first conductive gate;
forming a layer ("FG layer") to provide at least two conductive floating gates for the memory cell, wherein each floating gate comprises a first portion and an upward protruding second portion, the second portion being formed over the first dielectric and overlaying a sidewall of the first conductive gate;
wherein the FG layer consists of one or more sub-layers all of which are present in both the first and the second portions of the floating gates;
wherein forming the FG layer comprises:
forming the FG layer over the first structure; and then
etching the FG layer anisotropically without a mask over the memory cell to remove the FG layer from over the top of the first structure but leave the FG layer over the first dielectric over the sidewall of the first structure.

19. The method of claim 18 further comprising forming substrate isolation regions, each substrate isolation region being a dielectric region having a portion protruding above the semiconductor substrate;
wherein forming the FG layer over the first structure results in the FG layer having a greater thickness between the substrate isolation regions next to the first structure than over the substrate isolation regions;
wherein etching the FG layer results in the FG layer being etched off from over at least portions of the substrate isolation regions and the first structure but not between the substrate isolation regions next to the first structure.

20. The method of claim 18 wherein the memory cell is one of a plurality of the memory cells, and the method further comprises a masked etch of the FG layer to remove portions of the FG layer between different memory cells.

21. The method of claim 18 further comprising forming two second conductive gates for the memory cell, the second conductive gates being insulated from the first conductive gate and the floating gates.

22. The method of claim 18 wherein the memory cell comprises two source/drain regions and a channel region which borders on the source/drain regions, and each floating gate of the memory cell is operable to control a portion of the channel region.

23. The method of claim 18 further comprising forming two second conductive gates for the memory cell, the second conductive gates being insulated from the first conductive gate and the floating gates, wherein the memory cell comprises two source/drain regions and a channel region which borders on the source/drain regions, and each floating gate in combination with a respective one of the second conductive gates is operable to control a respective portion of the channel region.

24. The method of claim 23 wherein the first conductive gate is operable to control a portion of the channel region between said two respective portions of the channel region.

25. The method of claim 18 wherein the memory cell comprises two source/drain regions and a channel region which borders on the source/drain regions, and each floating gate of the memory cell overlies a portion of the channel region.

26. The method of claim 18 wherein the second portions of at least two floating gates overlay respective two opposites sidewalls of the first conductive gate.

27. A method for manufacturing an integrated circuit comprising a nonvolatile memory, the method comprising:
   forming a first structure over a semiconductor substrate, the first structure comprising:
      a first conductive gate of a nonvolatile memory cell; and
      a first dielectric over the first conductive gate;
   forming a layer ("FG layer") to provide at least two conductive floating gates for the memory cell, wherein each floating gate comprises a first portion and an upward protruding second portion, the second portion being formed over the first dielectric and overlaying a sidewall of the first conductive gate;
   forming two second conductive gates for the memory cell, the second conductive gates being insulated from the first conductive gate and the floating gates;
   wherein forming the FG layer to provide the floating gates comprises:
   forming the FG layer;
   forming a dielectric D1 over the FG layer;
   forming a layer G2 over the dielectric D1, wherein each second conductive gate comprises a portion of the layer G2, wherein the layer G2 has a portion P1 protruding above the first conductive gate;
   forming a layer L1 over the layer G2 such that the protruding portion P1 is exposed and not completely covered by the layer L1;
   at least partially removing the protruding portion P1 to form a through hole in the layer G2 over the first conductive gate, wherein at a conclusion of this removing operation a portion of the layer G2 remains covered by the layer L1;
   forming a layer L2 on the layer G2 adjacent to the through hole; and
   removing at least parts of the layers L1 and G2 and of the FG layer selectively to the layer L2.

28. The method of claim 27 wherein the memory cell is one of a plurality of the memory cells, and the method further comprises a masked etch of the FG layer to remove portions of the FG layer between different memory cells.

29. The method of claim 27 further comprising forming two second conductive gates for the memory cell, the second conductive gates being insulated from the first conductive gate and the floating gates.

30. The method of claim 27 wherein the memory cell comprises two source/drain regions and a channel region which borders on the source/drain regions, and each floating gate of the memory cell is operable to control a portion of the channel region.

31. The method of claim 27 further comprising forming two second conductive gates for the memory cell, the second conductive gates being insulated from the first conductive gate and the floating gates, wherein the memory cell comprises two source/drain regions and a channel region which borders on the source/drain regions, and each floating gate in combination with a respective one of the second conductive gates is operable to control a respective portion of the channel region.

32. The method of claim 31 wherein the first conductive gate is operable to control a portion of the channel region between said two respective portions of the channel region.

33. The method of claim 27 wherein the memory cell comprises two source/drain regions and a channel region which borders on the source/drain regions, and each floating gate of the memory cell overlies a portion of the channel region.

34. The method of claim 27 wherein the second portions of at least two floating gates overlay respective two opposite-sidewalls of the first conductive gate.

35. The method of claim 27 wherein the first conductive gate is formed before the FG layer.

36. A method for manufacturing an integrated circuit comprising a nonvolatile memory, the method comprising:
   forming a first structure over a semiconductor substrate, the first structure comprising:
      a first conductive gate of a nonvolatile memory cell; and
      a first dielectric over the first conductive gate;
   forming a layer ("FG layer") to provide at least two conductive floating gates for the memory cell, wherein each floating gate comprises a first portion and an upward protruding second portion, the second portion being formed over the first dielectric and overlaying a sidewall of the first conductive gate;
   wherein the memory cell comprises two source/drain regions and a channel region which borders on the source/drain regions, and each floating gate of the memory cell overlies a portion of the channel region.

37. The method of claim 36 wherein the first conductive gate is formed before the FG layer.

38. A method for manufacturing an integrated circuit comprising a nonvolatile memory, the method comprising:
   forming a first structure over a semiconductor substrate, the first structure comprising:
      a first conductive gate of a nonvolatile memory cell; and
      a first dielectric over the first conductive gate;
   forming a layer ("FG layer") to provide at least two conductive floating gates for the memory cell, wherein each floating gate comprises a first portion and an upward protruding second portion, the second portion being formed over the first dielectric and overlaying a sidewall of the first conductive gate;
   wherein the second portions of at least two floating gates overlay respective two opposite sidewalls of the'first conductive gate.

39. The method of claim 38 wherein the first conductive gate is formed before the FG layer.

* * * * *